US012644707B2

(12) United States Patent (10) Patent No.: US 12,644,707 B2
Kigure (45) Date of Patent: Jun. 2, 2026

(54) INERTIAL SENSOR AND INTERTIAL MEASUREMENT UNIT

(71) Applicant: SEIKO EPSON CORPORATION, Tokyo (JP)

(72) Inventor: Shota Kigure, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 281 days.

(21) Appl. No.: 18/414,116

(22) Filed: Jan. 16, 2024

(65) Prior Publication Data

US 2024/0240947 A1 Jul. 18, 2024

(30) Foreign Application Priority Data

Jan. 18, 2023 (JP) ................................. 2023-005674

(51) Int. Cl.
*G01C 21/16* (2006.01)
*G01C 19/5733* (2012.01)

(52) U.S. Cl.
CPC ......... *G01C 21/16* (2013.01); *G01C 19/5733* (2013.01); *B81B 2201/0228* (2013.01); *B81B 2203/0136* (2013.01); *B81B 2203/0353* (2013.01); *B81B 2207/07* (2013.01)

(58) Field of Classification Search
CPC ................ G01C 21/16; G01C 19/5733; B81B 2201/0228; B81B 2203/0136; B81B 2203/0353; B81B 2207/07
See application file for complete search history.

(56) References Cited

U.S. PATENT DOCUMENTS

| | | | |
|---|---|---|---|
| 5,983,721 A | 11/1999 | Sulzberger et al. | |
| 7,322,242 B2 | 1/2008 | Merassi et al. | |
| 8,393,215 B2 | 3/2013 | Stahl et al. | |
| 8,443,671 B2 | 5/2013 | Classen et al. | |
| 8,796,789 B2 | 8/2014 | Uto et al. | |
| 2010/0212423 A1 | 8/2010 | Rehle | |
| 2017/0010295 A1 | 1/2017 | Kigure et al. | |

(Continued)

FOREIGN PATENT DOCUMENTS

| | | |
|---|---|---|
| JP | H10-111312 A | 4/1998 |
| JP | H10-308519 A | 11/1998 |

(Continued)

OTHER PUBLICATIONS

WO-2018135211-A1, English Translation (Year: 2018).*

*Primary Examiner* — Ryan D Walsh
(74) *Attorney, Agent, or Firm* — Rankin, Hill & Clark LLP

(57) ABSTRACT

An inertial sensor includes: a base including a mount and a mount; a lid including a conductive member; and a sensor element coupled to the mount, the mount, and the conductive member. The sensor element includes a conductor bonded to the mount through a bonding part and coupled to the conductive member, a movable electrode including electrode fingers electrically coupled to the conductor, and a supporter provided between the movable electrode and the conductor and bonded to the mount through a bonding part. The supporter includes, in a plan view, a first part of the supporter overlapping the bonding part, and a second part of the supporter not overlapping the bonding part. The second part of the supporter is formed with a slit serving as a first through hole.

8 Claims, 16 Drawing Sheets

(56)          References Cited

U.S. PATENT DOCUMENTS

| | | | |
|---|---|---|---|
| 2017/0010298 A1 | 1/2017 | Tanaka | |
| 2017/0010299 A1 | 1/2017 | Kigure | |
| 2017/0010300 A1 | 1/2017 | Kigure et al. | |
| 2017/0074896 A1 | 3/2017 | Tanaka et al. | |
| 2018/0156839 A1 | 6/2018 | Tanaka | |
| 2018/0156840 A1 | 6/2018 | Kigure | |
| 2019/0064203 A1 | 2/2019 | Tanaka | |
| 2019/0162539 A1 | 5/2019 | Kihara | |
| 2019/0383610 A1* | 12/2019 | Torimoto | G01C 19/56 |
| 2020/0278377 A1* | 9/2020 | Takizawa | G01P 15/18 |
| 2022/0163558 A1* | 5/2022 | Nagata | G01P 15/0802 |
| 2024/0240946 A1* | 7/2024 | Kigure | G01C 21/16 |

FOREIGN PATENT DOCUMENTS

| | | | | |
|---|---|---|---|---|
| JP | 2003-329704 | A | 11/2003 | |
| JP | 2007-139505 | A | 6/2007 | |
| JP | 2009-92396 | A | 4/2009 | |
| JP | 2009-224462 | A | 10/2009 | |
| JP | 2017-20886 | A | 1/2017 | |
| JP | 2017-20888 | A | 1/2017 | |
| JP | 2017-20897 | A | 1/2017 | |
| JP | 2017-20898 | A | 1/2017 | |
| JP | 2017-20899 | A | 1/2017 | |
| JP | 2018-91818 | A | 6/2018 | |
| JP | 2018-91820 | A | 6/2018 | |
| JP | 2019-39822 | A | 3/2019 | |
| JP | 2019-100726 | A | 6/2019 | |
| WO | 2012/014792 | A1 | 2/2012 | |
| WO | WO-2018135211 | A1 * | 7/2018 | G01C 19/5747 |

* cited by examiner

INERTIAL SENSOR AND INTERTIAL MEASUREMENT UNIT

BACKGROUND

The present application is based on, and claims priority from JP Application Serial Number 2023-005674, filed Jan. 18, 2023, the disclosure of which is hereby incorporated by reference herein in its entirety.

1. Technical Field

The present disclosure relates to an inertial sensor and an inertial measurement unit including the inertial sensor.

2. Related Art

JP-A-2018-91818 discloses an inertial sensor including a movable part that is swingable with respect to a substrate, a supporter bonded to the substrate and supporting the movable part, and a protrusion provided between the movable part and the supporter, in which the protrusion reduces a bonding stress caused by bonding between the supporter and the substrate.

JP-A-2018-91818 is an example of the related art.

However, even with the inertial sensor disclosed in JP-A-2018-91818, it is difficult to sufficiently reduce the stress, and further improvement in stress reduction is desired.

SUMMARY

An inertial sensor according to an aspect of the present application includes: a substrate including a first mount and a second mount; a lid that faces the substrate and that includes a conductive member electrically coupling the substrate side and the opposite side from the substrate; and a sensor element provided between the substrate and the lid, the substrate side of the sensor element being bonded to the first mount and the second mount, the lid side of the sensor element being coupled to the conductive member. The sensor element includes a first coupling part bonded to the first mount through a first bonding part and coupled to the conductive member, an electrode including electrode fingers electrically coupled to the first coupling part, a second coupling part provided between the electrode and the first coupling part and bonded to the second mount through a second bonding part, and a wiring provided between the first coupling part and the second coupling part. The second coupling part includes, in a plan view, a first part of the second coupling part overlapping the second bonding part, and a second part of the second coupling part not overlapping the second bonding part. The second part of the second coupling part has a first through hole.

An inertial sensor according to an aspect of the present application includes: a substrate including a first mount and a second mount; a lid that faces the substrate and that includes a conductive member electrically coupling the substrate side and the opposite side from the substrate; and a sensor element provided between the substrate and the lid, the substrate side of the sensor element being bonded to the first mount and the second mount, the lid side of the sensor element being coupled to the conductive member. The sensor element includes a first coupling part bonded to the first mount through a first bonding part and coupled to the conductive member, an electrode including electrode fingers electrically coupled to the first coupling part, a second coupling part provided between the electrode and the first coupling part and bonded to the second mount through a second bonding part, and a wiring provided between the first coupling part and the second coupling part. The first coupling part includes, in a plan view, a first part of the first coupling part overlapping the first bonding part, and a second part of the first coupling part not overlapping the first bonding part. The second part of the first coupling part has a through hole.

An inertial sensor according to an aspect of the present application includes: a substrate including a first mount, a second mount, and a third mount; a lid that faces the substrate and that includes a conductive member electrically coupling the substrate side and the opposite side from the substrate; and a sensor element provided between the substrate and the lid, the substrate side of the sensor element being bonded to the first mount, the second mount, and the third mount, the lid side of the sensor element being coupled to the conductive member. The first mount, the second mount, and the third mount are provided in an order of the third mount, the first mount, and the second mount along a first direction. The sensor element includes a first coupling part bonded to the first mount through a first bonding part and coupled to the conductive member, an electrode including electrode fingers electrically coupled to the first coupling part, a second coupling part provided between the electrode and the first coupling part and bonded to the second mount through a second bonding part, a first wiring provided between the first coupling part and the second coupling part, a third coupling part provided between the electrode and the first coupling part and bonded to the third mount through a third bonding part, and a second wiring provided between the first coupling part and the third coupling part. The second coupling part includes, in a plan view, a first part of the second coupling part overlapping the second bonding part, and a second part of the second coupling part not overlapping the second bonding part. The second part of the second coupling part has a first through hole. The third coupling part includes, in a plan view, a first part of the third coupling part overlapping the third bonding part, and a second part of the third coupling part not overlapping the third bonding part. The second part of the third coupling part has a second through hole.

An inertial sensor according to an aspect of the present application includes: a substrate including a first mount, a second mount, and a third mount; a lid that faces the substrate and that includes a conductive member electrically coupling the substrate side and the opposite side from the substrate; and a sensor element provided between the substrate and the lid, the substrate side of the sensor element being bonded to the first mount, the second mount, and the third mount, the lid side of the sensor element being coupled to the conductive member. The first mount, the second mount, and the third mount are provided in an order of the third mount, the first mount, and the second mount along a first direction. The sensor element includes a first coupling part bonded to the first mount through a first bonding part and coupled to the conductive member, an electrode including electrode fingers electrically coupled to the first coupling part, a second coupling part provided between the electrode and the first coupling part and bonded to the second mount through a second bonding part, a first wiring provided between the first coupling part and the second coupling part, a third coupling part provided between the electrode and the first coupling part and bonded to the third mount through a third bonding part, and a second wiring provided between the first coupling part and the third coupling part. The first coupling part includes, in a plan view, a first part of the first coupling part overlapping the first bonding part, and a second part of the first coupling part not overlapping the first bonding part. The second part of the first coupling part has a first through hole between the first wiring and the second part of the first coupling part, and has a second through hole between the second wiring and the second part of the first coupling part.

An inertial measurement unit according to an aspect of the present application includes: the above-described inertial sensor.

BRIEF DESCRIPTION OF THE DRAWINGS

FIG. 4 is a partially enlarged plan view of the inertial sensor in FIG. 1.

FIG. 9 is a cross-sectional view of the inertial sensor taken along a line G-G in FIG. 8.

FIG. 14 is an exploded perspective view showing a schematic configuration of an inertial measurement unit.

DESCRIPTION OF EMBODIMENTS

Hereinafter, an embodiment of the present disclosure will be described with reference to the drawings.

In the following drawings, in order to make each component easier to see, the scale of dimensions may be changed depending on the component.

Hereinafter, for convenience of description, three axes orthogonal to one another are referred to as an X axis, a Y axis, and a Z axis, and a direction parallel to the X axis is referred to as an "X-axis direction", a direction parallel to the Y axis is referred to as a "Y-axis direction", and a direction parallel to the Z axis is referred to as a "Z-axis direction". In addition, a tip end side of each axis in an arrow direction is also referred to as a "plus side", and an opposite side is also referred to as a "minus side". Hereinafter, viewing in the Z-axis direction is also referred to as a "plan view", and viewing in the Y-axis direction with respect to a cross section including the Z axis is also referred to as a "cross-sectional view".

Further, in the following description, for example, for a base, a description "on the base" indicates any one of a case of being disposed in contact with the base, a case of being disposed on the base through another structure, and a case of being disposed on the base partially in contact with the base and partially disposed through another structure. In addition, in a description of an "upper surface" of a certain configuration, a surface on a plus side of the configuration in the Z-axis direction, for example, an "upper surface of a base" indicates a surface on the plus side of the base in the Z-axis direction. In addition, in a description of a "lower surface" of a certain configuration, a surface on a minus side of the configuration in the Z-axis direction, for example, a "lower surface of a lid" indicates a surface on the minus side of the lid in the Z-axis direction.

1. Embodiment 1

Figure 1:
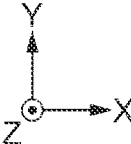
FIG. 1 is a plan view of an inertial sensor according to Embodiment 1.
Figure 2:
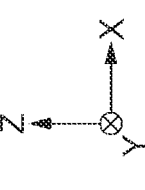
FIG. 2 is a cross-sectional view of the inertial sensor taken along a line D-D in FIG. 1.
Figure 3:
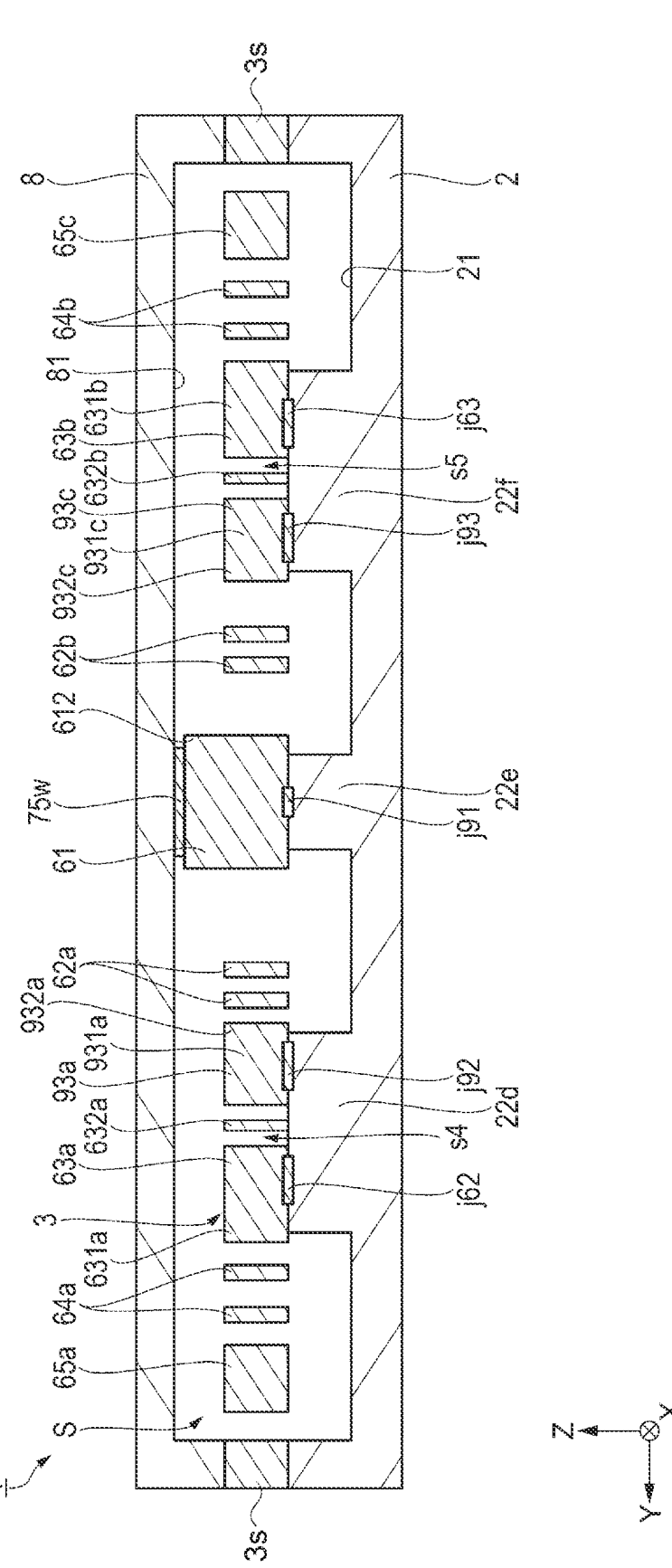
FIG. 3 is a cross-sectional view of the inertial sensor taken along a line E-E in FIG. 1.
Figure 4:
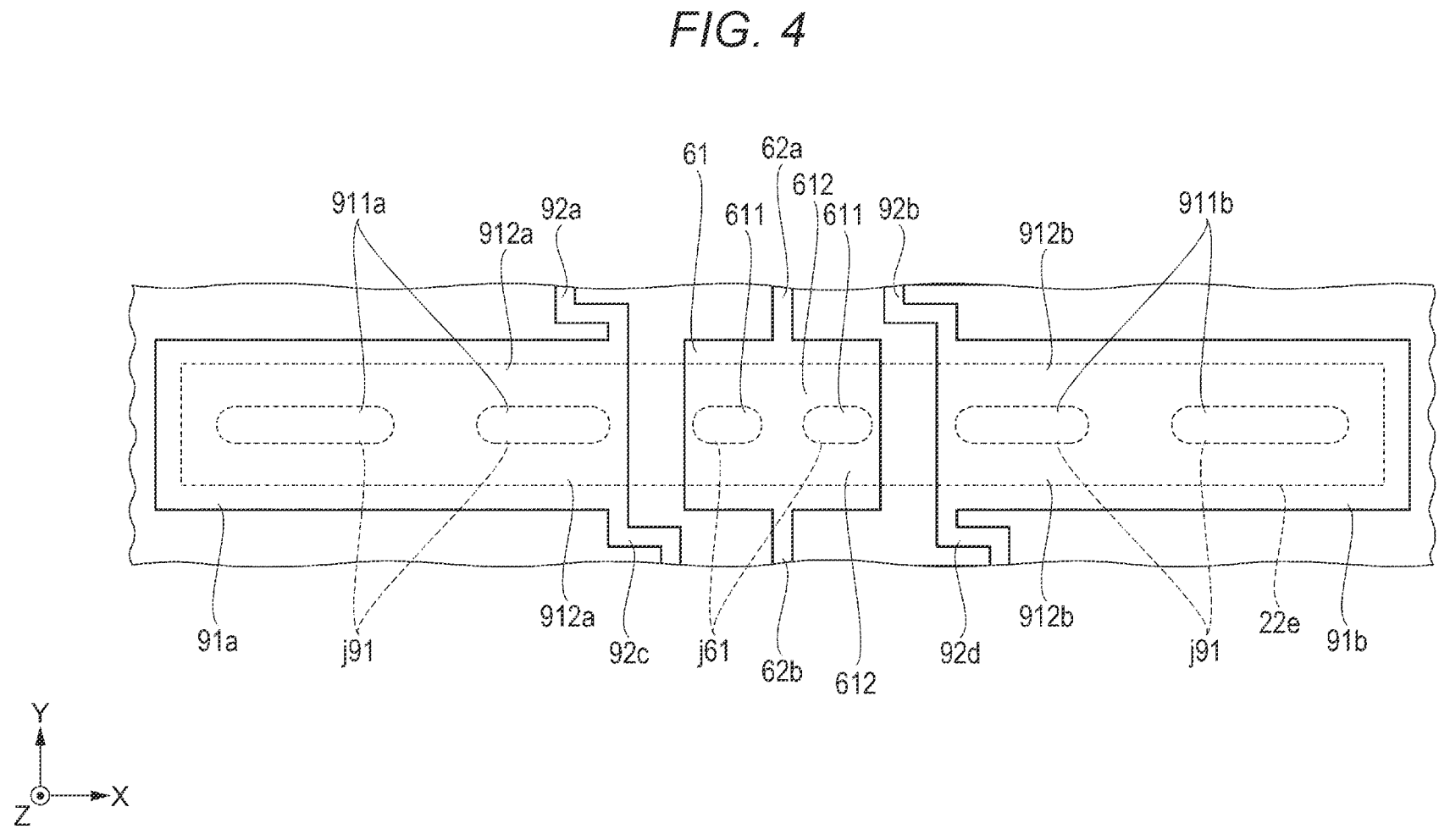
Figure 5A:
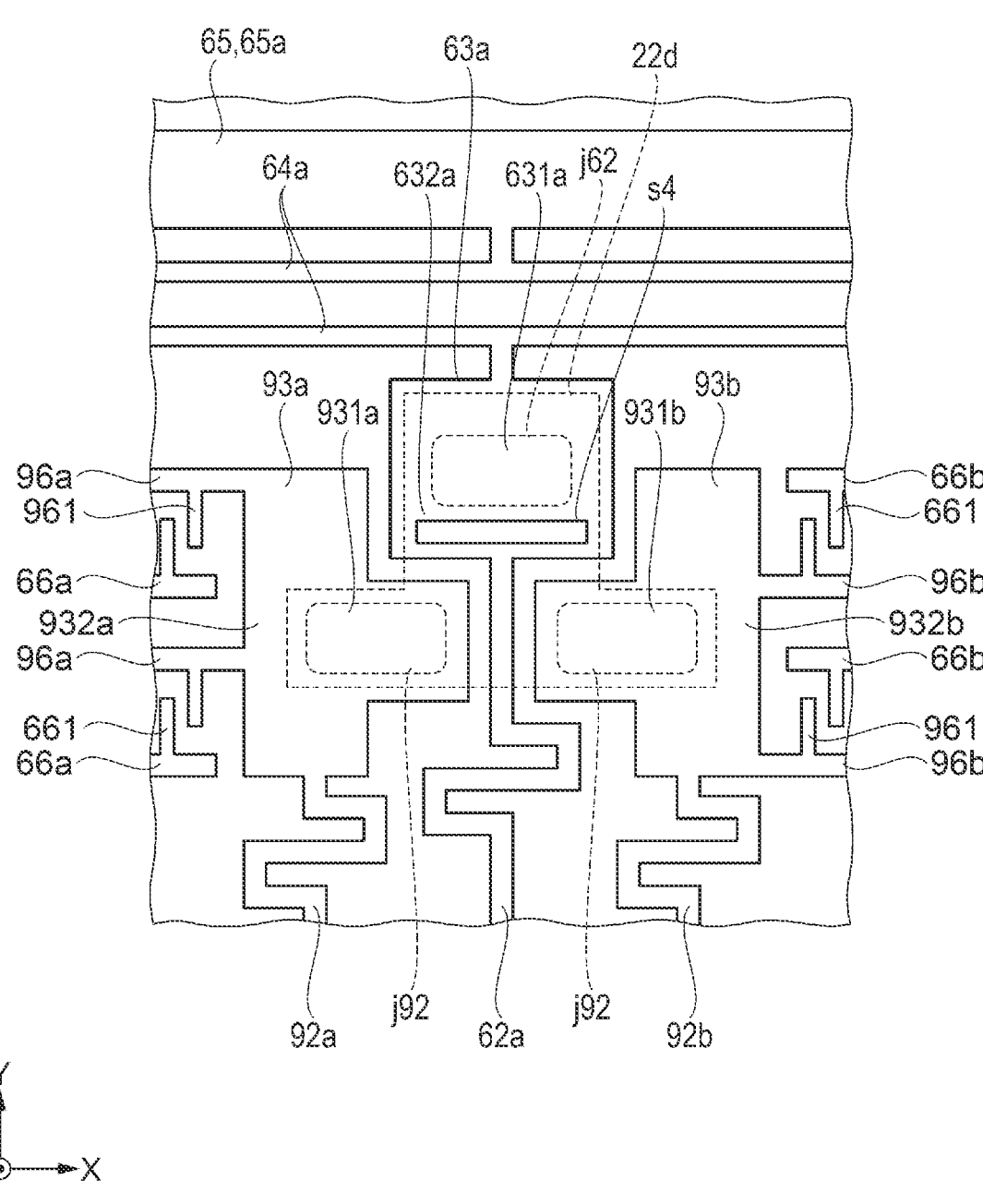
FIG. 5A is a partially enlarged plan view of the inertial sensor in FIG. 1.
Figure 5B:
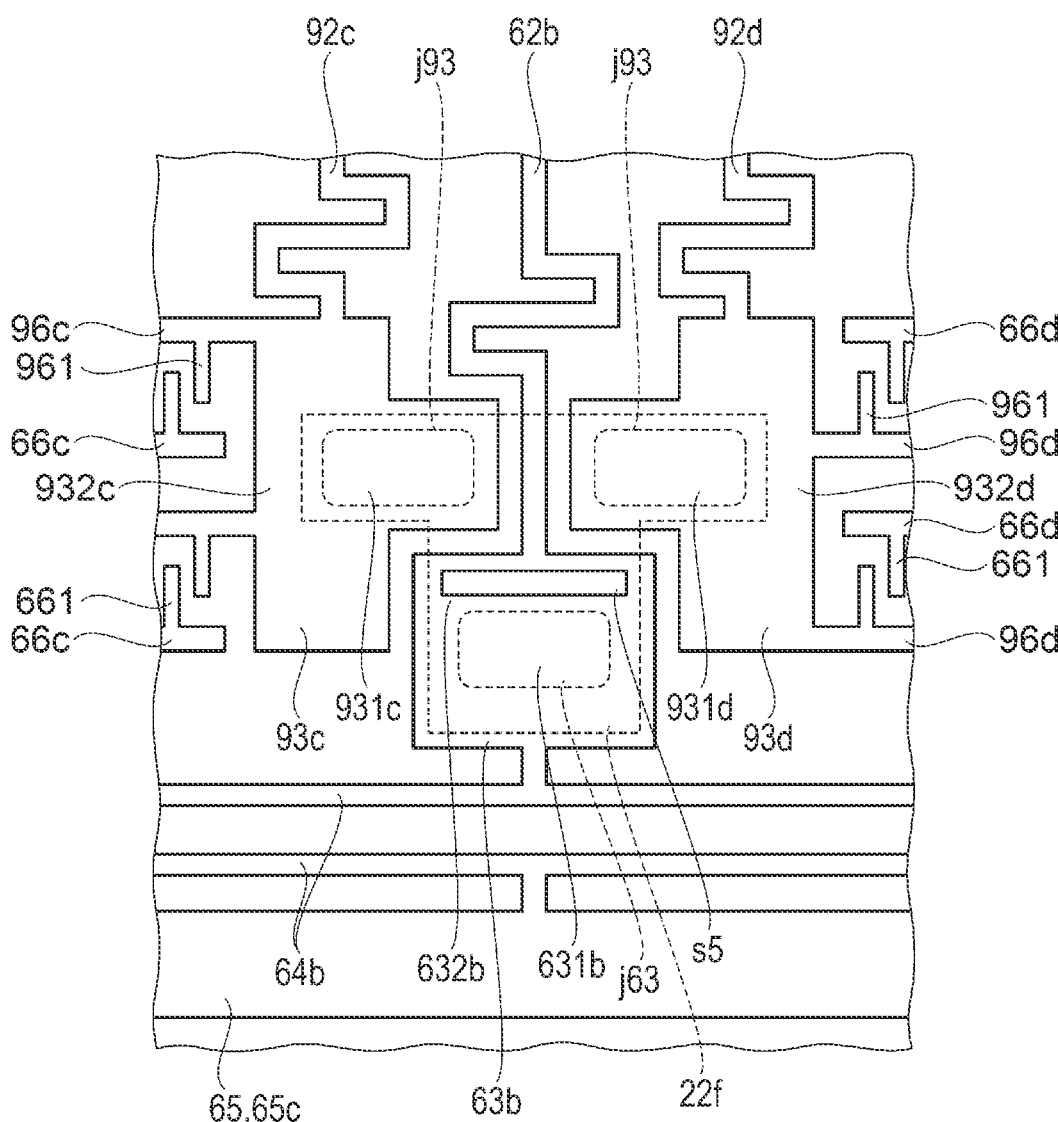
FIG. 5B is a partially enlarged plan view of the inertial sensor in FIG. 1.
Figure 5B:
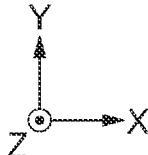

FIG. 1 is a plan view showing an inertial sensor according to Embodiment 1. In FIG. 1, a lid 8 is made transparent for convenience of description. FIG. 2 is a cross-sectional view taken along a line D-D in FIG. 1. FIG. 3 is a cross-sectional view taken along a line E-E in FIG. 1. FIGS. 4, 5A, and 5B are partially enlarged plan views of the inertial sensor shown in FIG. 1.

An inertial sensor 1 shown in FIG. 1 is an acceleration sensor capable of detecting an acceleration Ay in a Y-axis direction. Such an inertial sensor 1 includes a base 2, a sensor element 3 disposed on the base 2, and the lid 8 bonded to the base 2 in a manner of covering the sensor element 3.

Hereinafter, details of the inertial sensor 1 according to Embodiment 1 will be described in the following items.

1.1. Base
1.2. Lid
1.3. Sensor Element
1. Movable Electrode Part
2. Fixed Electrode Part
3. Slit
1.4. Modifications
1. Modification 1
2. Modification 2
3. Modification 3
4. Modification 4
1.1. Base As shown in FIG. 1, the base 2 has a rectangular shape in a plan view. The base 2 has a recess 21 that is open to an upper surface side. In the plan view, the recess 21 is formed larger than the sensor element 3 to include the sensor element 3 therein. The recess 21 functions as an escape part for preventing contact between the sensor element 3 and the base 2.

As shown in FIG. 3, the base 2 has protruding mounts 22d, 22e, and 22f provided at a bottom surface of the recess 21 along the Y-axis direction. Further, a lower surface of the sensor element 3 is bonded to the mounts 22d, 22e, and 22f. In the embodiment, a plus side in the Y-axis direction corresponds to a first direction.

In addition, a semiconductor layer 3s is provided on an upper surface of a periphery of the base 2 through an insulating layer (not shown). The semiconductor layer 3s is a part of a silicon substrate attached to the base 2 through the insulating layer. The silicon substrate is doped with an impurity such as phosphorus (P) or boron (B). The semiconductor layer 3s and the sensor element 3 are formed by patterning the silicon substrate. The silicon substrate is attached to the base 2 through the insulating layer to form a silicon on insulator (SOI) substrate.

As shown in FIG. 1, the mount 22e is provided at the center in the Y-axis direction in a manner of extending along the X-axis direction, and a conductor 61, a conductor 91a, and a conductor 91b of the sensor element 3 are bonded to an upper surface of the mount 22e. In the embodiment, the mount 22e corresponds to a first mount.

A mount 22d is provided at the center in the X-axis direction on the plus side of the mount 22e in the Y-axis direction, and a supporter 63a, a supporter 93a, and a supporter 93b of the sensor element 3 are bonded to an upper surface of the mount 22d. In the embodiment, the mount 22d corresponds to a second mount.

The mount 22f is provided at the center in the X-axis direction on a minus side of the mount 22e in the Y-axis direction, and a supporter 63b, a supporter 93c, and a supporter 93d of the sensor element 3 are bonded to an upper surface of the mount 22f. In the embodiment, the mount 22f corresponds to a third mount.

In the embodiment, a silicon substrate is used as the base 2. The base 2 may be a glass substrate or a ceramic substrate.

1.2. Lid

As shown in FIG. 1, the lid 8 has a rectangular shape in a plan view.

As shown in FIG. 2, the lid 8 is bonded to the semiconductor layer 3s. The lid 8 has a recess 81 on a lower surface side. A movable electrode part 6 and a fixed electrode part 9 of the sensor element 3 are accommodated in a storage space S surrounded by the recess 81 of the lid 8, the semiconductor layer 3s, and the recess 21 of the base 2.

It is preferable that inert gas such as nitrogen, helium, or argon is sealed in the storage space S, and the storage space S is substantially at an atmospheric pressure at a use temperature (about –40° C. to 80° C.). By setting the storage space S to the atmospheric pressure, a viscous resistance is increased and a damping effect is exerted, and a vibration of a movable part 65 of the sensor element 3 can be quickly converged or stopped. Therefore, detection accuracy of an acceleration of the inertial sensor 1 serving as an acceleration sensor is improved.

In the embodiment, a glass substrate is used as the lid 8. The lid 8 may be a silicon substrate or a ceramic substrate.

In addition, a method for bonding the lid 8 and the semiconductor layer 3s is not particularly limited. The method for bonding the base 2 and the semiconductor layer 3s may be appropriately selected depending on a material of the lid 8. In the embodiment, the base 2 and the semiconductor layer 3s are bonded to each other via a glass frit made of low-melting-point glass, which is an example of a bonding material.

A terminal 75, a terminal 76, and a terminal 77 for external coupling are provided at an upper surface of the lid 8. In addition, a wiring 75w, a wiring 76w, and a wiring 77w are provided at a lower surface of the lid 8.

The terminal 75 is electrically coupled to the wiring 75w through a conductive member 85 penetrating the lid 8.

The terminal 76 is electrically coupled to the wiring 76w through a conductive member 86 penetrating the lid 8.

The terminal 77 is electrically coupled to the wiring 77w through a conductive member 87 penetrating the lid 8.

The wiring 75w is in contact with the conductor 61 of the sensor element 3 and is electrically coupled to the conductor 61.

The wiring 76w is in contact with the conductor 91a of the sensor element 3 and is electrically coupled to the conductor 91a.

The wiring 77w is in contact with the conductor 91b of the sensor element 3 and is electrically coupled to the conductor 91b.

In the embodiment, a thickness of the conductor 61 of the sensor element 3 is increased and the conductor 61 protrudes toward the lid 8, so that the conductor 61 is brought into contact with the wiring 75w. However, the present disclosure is not limited thereto. A configuration may also be adopted in which a protrusion protruding toward the conductor 61 is provided at the lid 8, and the wiring 75w is routed around at a lower surface of the protrusion to bring the wiring 75w and the conductor 61 into contact.

In addition, in the embodiment, a thickness of the conductor 91a of the sensor element 3 is increased and the conductor 91a protrudes toward the lid 8, so that the conductor 91a is brought into contact with the wiring 76w. However, the present disclosure is not limited thereto. A configuration may also be adopted in which a protrusion protruding toward the conductor 91a is provided at the lid 8, and the wiring 76w is routed around at a lower surface of the protrusion to bring the wiring 76w and the conductor 91a into contact.

In addition, in the embodiment, a thickness of the conductor 91b of the sensor element 3 is increased and the conductor 91b protrudes toward the lid 8, so that the conductor 91b is brought into contact with the wiring 77w. However, the present disclosure is not limited thereto. A configuration may also be adopted in which a protrusion protruding toward the conductor 91b is provided at the lid 8, and the wiring 77w is routed around at a lower surface of the protrusion to bring the wiring 77w and the conductor 91b into contact.

1.3. Sensor Element

As shown in FIG. 1, the sensor element 3 includes the movable electrode part 6 fixed to the base 2 and the fixed electrode part 9 fixed to the base 2.

The sensor element 3 is bonded to the mounts 22d, 22e, and 22f of the base 2 by anodic bonding. However, the material of the sensor element 3 and the method for bonding the sensor element 3 to the base 2 are not particularly limited.

1.3.1. Movable Electrode Part

The movable electrode part 6 includes the conductor 61, wirings 62a and 62b, the supporters 63a and 63b, springs 64a and 64b, the movable part 65, and a movable electrode 66. The movable electrode 66 includes movable electrodes 66a, 66b, 66c, and 66d, and each of the movable electrodes 66a, 66b, 66c, and 66d includes electrode fingers 661 having a comb tooth shape. The conductor 61, the wirings 62a and 62b, the supporters 63a and 63b, the springs 64a and 64b, the movable part 65, and the movable electrodes 66a, 66b, 66c, and 66d are integrally formed and electrically coupled.

1.3.1.1. Conductor

As shown in FIG. 2, the conductor 61 is formed thicker than other structures of the movable electrode part 6 when patterning the silicon substrate, and has a structure in which an upper surface side of the conductor 61 protrudes toward the lid 8.

The upper surface side of the conductor 61 is in contact with the wiring 75w of the lid 8 and is electrically coupled to the terminal 75.

A lower surface side of the conductor 61 is bonded to the mount 22e of the base 2 through bonding parts j61. The bonding part j61 indicates a part where the sensor element 3 and the base 2 are anodically bonded.

As shown in FIG. 4, the conductor 61 includes, in a plan view, a first part 611 overlapping the bonding part j61 and a second part 612 not overlapping the bonding part j61. In other words, the first part 611 is a part directly bonded to the mount 22*e*, and the second part 612 is a part not directly bonded to the mount 22*e*. In the embodiment, the conductor 61 corresponds to a first coupling part, and the bonding part j61 corresponds to a first bonding part.

1.3.1.2. Supporter

As shown in FIG. 3, the supporter 63*a* is bonded to the mount 22*d* of the base 2 through a bonding part j62. The bonding part j62 indicates a part where the sensor element 3 and the base 2 are anodically bonded.

As shown in FIG. 5A, the supporter 63*a* includes, in a plan view, a first part 631*a* overlapping the bonding part j62 and a second part 632*a* not overlapping the bonding part j62. In other words, the first part 631*a* of the supporter 63*a* is a part directly bonded to the mount 22*d*, and the second part 632*a* of the supporter 63*a* is a part not directly bonded to the mount 22*d*. In the embodiment, the supporter 63*a* corresponds to a second coupling part, and the bonding part j62 corresponds to a second bonding part.

As shown in FIG. 3, the supporter 63*b* is bonded to the mount 22*f* of the base 2 through a bonding part j63. The bonding part j63 indicates a part where the sensor element 3 and the base 2 are anodically bonded.

As shown in FIG. 5B, the supporter 63*b* includes, in a plan view, a first part 631*b* overlapping the bonding part j63 and a second part 632*b* not overlapping the bonding part j63. In other words, the first part 631*b* of the supporter 63*b* is a part directly bonded to the mount 22*f*, and the second part 632*b* of the supporter 63*b* is a part not directly bonded to the mount 22*f*. In the embodiment, the supporter 63*b* corresponds to a third coupling part, and the bonding part j63 corresponds to a third bonding part.

1.3.1.3. Wiring

As shown in FIG. 1, the wiring 62*a* is provided between the conductor 61 and the supporter 63*a*. A width of the wiring 62*a* is smaller than a width of the second part 612 of the conductor 61 or the second part 632*a* of the supporter 63*a*, that is, a length in the X-axis direction. Accordingly, a reduction in size of the wiring 62*a* can be achieved. The wiring 62*a* functions as a spring.

The wiring 62*b* is provided between the conductor 61 and the supporter 63*b*. A width of the wiring 62*b* is smaller than a width of the second part 612 of the conductor 61 or the second part 632*b* of the supporter 63*b*, that is, a length in the X-axis direction. Accordingly, a reduction in size of the wiring 62*b* can be achieved. In addition, the wiring 62*b* functions as a spring.

1.3.1.4. Movable Part

As shown in FIG. 1, the movable part 65 has a frame shape in a plan view, and includes a Y-axis extension 65*a*, an X-axis extension 65*b*, a Y-axis extension 65*c*, and an X-axis extension 65*d*.

The movable part 65 is swingable in the Y-axis direction by a spring 64*a* provided between the Y-axis extension 65*a* and the supporter 63*a* and a spring 64*b* provided between the Y-axis extension 65*c* and the supporter 63*b*. Widths of springs 64*a* and 64*b* are substantially equal to or less than those of the wirings 62*a* and 62*b*.

A movable electrode 66*b* and a movable electrode 66*d* are provided at the X-axis extension 65*b* of the movable part 65. A plurality of movable electrodes 66*b* and a plurality of movable electrodes 66*d* are provided. Each of the movable electrodes 66*b* and 66*d* includes the electrode fingers 661 having a comb tooth shape.

A movable electrode 66*a* and a movable electrode 66*c* are provided at the X-axis extension 65*d* of the movable part 65.

A plurality of movable electrodes 66*a* and a plurality of movable electrodes 66*c* are provided. Each of the movable electrodes 66*a* and 66*c* includes the electrode fingers 661 having a comb tooth shape.

The movable electrodes 66*a*, 66*b*, 66*c*, and 66*d* are each provided with the electrode fingers 661. The widths of the movable electrode 66*a*, 66*b*, 66*c*, and 66*d* are equal to or less than those of the wirings 62*a* and 62*b*.

1.3.2. Fixed Electrode Part

As shown in FIG. 1, the fixed electrode part 9 includes a first fixed electrode part 9*a* provided on a minus side of the conductor 61 in the X-axis direction, and a second fixed electrode part 9*b* provided on a plus side of the conductor 61 in the X-axis direction.

1.3.2.1. First Fixed Electrode Part

The first fixed electrode part 9*a* includes the conductor 91*a*, wirings 92*a* and 92*c*, the supporters 93*a* and 93*c*, and a fixed electrode 96. The fixed electrode 96 includes fixed electrodes 96*a* and 96*c*, and each of the fixed electrodes 96*a* and 96*c* includes electrode fingers 961 having a comb tooth shape. The conductor 91*a*, the wirings 92*a* and 92*c*, the supporters 93*a* and 93*c*, and the fixed electrodes 96*a* and 96*c* are integrally formed and electrically coupled.

1.3.2.1.1. Conductor

As shown in FIG. 2, when the silicon substrate including the semiconductor layer 3*s* is patterned, the conductor 91*a* is formed thicker than other structures of the first fixed electrode part 9*a*, and has a structure in which an upper surface side of the conductor 91*a* protrudes toward the lid 8.

The upper surface side of the conductor 91*a* is in contact with the wiring 76*w* of the lid 8 and is electrically coupled to the terminal 76. A lower surface side of the conductor 91*a* is bonded to the mount 22*e* of the base 2 through bonding parts j91. The bonding part j91 indicates a part where the sensor element 3 and the base 2 are anodically bonded.

As shown in FIG. 4, the conductor 91*a* includes, in a plan view, first parts 911*a* overlapping the bonding parts j91 and a second part 912*a* not overlapping the bonding parts j91. In other words, the first part 911*a* is a part directly bonded to the mount 22*e*, and the second part 912*a* is a part not directly bonded to the mount 22*e*. In the embodiment, the conductor 91*a* corresponds to a first coupling part, and the bonding part j91 corresponds to a first bonding part.

1.3.2.1.2. Supporter

As shown in FIG. 3, the supporter 93*a* is bonded to the mount 22*d* of the base 2 through a bonding part j92. The bonding part j92 indicates a part where the sensor element 3 and the base 2 are anodically bonded.

As shown in FIG. 5A, the supporter 93*a* includes, in a plan view, a first part 931*a* overlapping the bonding part j92 and a second part 932*a* not overlapping the bonding part j92. In other words, the first part 931*a* of the supporter 93*a* is a part directly bonded to the mount 22*d*, and the second part 932*a* of the supporter 93*a* is a part not directly bonded to the mount 22*d*. In the embodiment, the supporter 93*a* corresponds to a second coupling part, and the bonding part j92 corresponds to a second bonding part.

The second part 932*a* of the supporter 93*a* is located between the first part 931*a* and the fixed electrode 96*a*. The second part 932*a* of the supporter 93*a* is located between the first part 931*a* and the wiring 92*a*. In the embodiment, the second part 932*a* is separated from the base 2, and protrudes from the mount 22*d* in a plan view. The second part 932*a* may also be referred to as a protrusion.

As shown in FIG. 3, the supporter 93*c* is bonded to the mount 22*f* of the base 2 through a bonding part j93. The bonding part j93 indicates a part where the sensor element 3 and the base 2 are anodically bonded.

As shown in FIG. 5B, the supporter 93c includes, in a plan view, a first part 931c overlapping the bonding part j93 and a second part 932c not overlapping the bonding part j93. In other words, the first part 931c of the supporter 93c is a part directly bonded to the mount 22f, and the second part 932c of the supporter 93c is a part not directly bonded to the mount 22f. In the embodiment, the supporter 93c corresponds to a third coupling part, and the bonding part j93 corresponds to a third bonding part.

The second part 932c of the supporter 93c is located between the first part 931c and the fixed electrode 96c. The second part 932c of the supporter 93c is located between the first part 931c and the wiring 92c. In the embodiment, the second part 932c is separated from the base 2, and protrudes from the mount 22f in a plan view. The second part 932c may also be referred to as a protrusion.

1.3.2.1.3. Fixed Electrode

As shown in FIG. 1, the fixed electrode 96a extends from the supporter 93a to the minus side in the X-axis direction. The fixed electrode 96a includes the electrode fingers 961 having a comb tooth shape, and faces the electrode fingers 661 of the movable electrode 66a. A width of the fixed electrode 96a is substantially equal to a width of the movable electrode 66a.

The fixed electrode 96c extends from the supporter 93c to the minus side in the X-axis direction. The fixed electrode 96c includes the electrode fingers 961 having a comb tooth shape, and faces the electrode fingers 661 of the movable electrode 66c. A width of the fixed electrode 96c is substantially equal to a width of the movable electrode 66c.

1.3.2.1.4. Wiring

As shown in FIG. 1, the wiring 92a is provided between the conductor 91a and the supporter 93a. A width of the wiring 92a is smaller than a width of the second part 912a of the conductor 91a or the second part 932a of the supporter 93a, that is, a length in the X-axis direction. Accordingly, a reduction in size of the wiring 92a can be achieved. The wiring 92a functions as a spring.

The wiring 92c is provided between the conductor 91a and the supporter 93c. A width of the wiring 92c is smaller than a width of the second part 912a of the conductor 91a or the second part 932c of the supporter 93c, that is, a length in the X-axis direction. Accordingly, a reduction in size of the wiring 92c can be achieved. The wiring 92c functions as a spring.

1.3.2.2. Second Fixed Electrode Part

The second fixed electrode part 9b includes the conductor 91b, wirings 92b and 92d, the supporters 93b and 93d, and the fixed electrode 96. The fixed electrode 96 includes fixed electrodes 96b and 96d, and each of the fixed electrodes 96b and 96d includes the electrode fingers 961 having a comb tooth shape. The conductor 91b, the wirings 92b and 92d, the supporters 93b and 93d, and the fixed electrodes 96b and 96d are integrally formed and electrically coupled.

1.3.2.2.1. Conductor

As shown in FIG. 2, when the silicon substrate including the semiconductor layer 3s is patterned, the conductor 91b is formed thicker than other structures of the second fixed electrode part 9b, and has a structure in which an upper surface side of the conductor 91b protrudes toward the lid 8.

The upper surface side of the conductor 91b is in contact with the wiring 77w of the lid 8 and is electrically coupled to the terminal 77. A lower surface side of the conductor 91b is bonded to the mount 22e of the base 2 through bonding parts j91.

As shown in FIG. 4, the conductor 91b includes, in a plan view, a first part 911b overlapping the bonding part j91 and a second part 912b not overlapping the bonding part j91. In other words, the first part 911b is a part directly bonded to the mount 22e, and the second part 912b is a part not directly bonded to the mount 22e. In the embodiment, the conductor 91b corresponds to a first coupling part, and the bonding part j91 corresponds to a first bonding part.

1.3.2.2.2. Supporter

The supporter 93b is bonded to the mount 22d of the base 2 through the bonding part j92.

As shown in FIG. 5A, the supporter 93b includes, in a plan view, a first part 931b overlapping the bonding part j92 and a second part 932b not overlapping the bonding part j92. In other words, the first part 931b of the supporter 93b is a part directly bonded to the mount 22d, and the second part 932b of the supporter 93b is a part not directly bonded to the mount 22d. In the embodiment, the supporter 93b corresponds to a second coupling part, and the bonding part j92 corresponds to a second bonding part.

The second part 932b of the supporter 93b is located between the first part 931b and the fixed electrode 96b. The second part 932b of the supporter 93b is located between the first part 931b and the wiring 92b. In the embodiment, the second part 932b is separated from the base 2, and protrudes from the mount 22d in a plan view. The second part 932b may also be referred to as a protrusion.

The supporter 93d is bonded to the mount 22f of the base 2 through the bonding part j93.

As shown in FIG. 5B, the supporter 93d includes, in a plan view, a first part 931d overlapping the bonding part j93 and a second part 932d not overlapping the bonding part j93. In other words, the first part 931d of the supporter 93d is a part directly bonded to the mount 22f, and the second part 932d of the supporter 93d is a part not directly bonded to the mount 22f. In the embodiment, the supporter 93d corresponds to a third coupling part, and the bonding part j93 corresponds to a third bonding part.

The second part 932d of the supporter 93d is located between the first part 931d and the fixed electrode 96d. The second part 932d of the supporter 93d is located between the first part 931d and the wiring 92d. In the embodiment, the second part 932d is separated from the base 2, and protrudes from the mount 22f in a plan view. The second part 932d may also be referred to as a protrusion.

1.3.2.2.3. Fixed Electrode

As shown in FIG. 1, the fixed electrode 96b extends from the supporter 93b to the plus side in the X-axis direction. The fixed electrode 96b includes the electrode fingers 961 having a comb tooth shape, and faces the electrode fingers 661 of the movable electrode 66b. A width of the fixed electrode 96b is substantially equal to a width of the movable electrode 66b.

The fixed electrode 96d extends from the supporter 93d to the plus side in the X-axis direction. The fixed electrode 96d includes the electrode fingers 961 having a comb tooth shape, and faces the electrode fingers 661 of the movable electrode 66d. A width of the fixed electrode 96d is substantially equal to a width of the movable electrode 66d.

1.3.2.2.4. Wiring

As shown in FIG. 1, the wiring 92b is provided between the conductor 91b and the supporter 93b. A width of the wiring 92b is smaller than a width of the second part 912b of the conductor 91b or the second part 932b of the supporter 93b, that is, a length in the X-axis direction. Accordingly, a reduction in size of the wiring 92b can be achieved. In addition, the wiring 92b functions as a spring.

The wiring 92*d* is provided between the conductor 91*b* and the supporter 93*d*. A width of the wiring 92*d* is smaller than a width of the second part 912*b* of the conductor 91*b* or the second part 932*d* of the supporter 93*d*, that is, a length in the X-axis direction. Accordingly, a reduction in size of the wiring 92*d* can be achieved. In addition, the wiring 92*d* functions as a spring.

When the acceleration in the Y-axis direction is applied to such a sensor element 3, the movable part 65 is displaced in the Y-axis direction while elastically deforming the springs 64*a* and 64*b* based on a magnitude of the acceleration.

According to such a displacement, gaps between the movable electrode 66*a* and the fixed electrode 96*a*, between the movable electrode 66*b* and the fixed electrode 96*b*, between the movable electrode 66*c* and the fixed electrode 96*c*, and between the movable electrode 66*d* and the fixed electrode 96*d* change. According to the displacement, magnitudes of static capacitance between the movable electrode 66*a* and the fixed electrode 96*a*, between the movable electrode 66*b* and the fixed electrode 96*b*, between the movable electrode 66*c* and the fixed electrode 96*c*, and between the movable electrode 66*d* and the fixed electrode 96*d* change. Then, the acceleration Ay in the Y-axis direction can be detected based on the change in the static capacitance.

1.3.3. Slit

As shown in FIG. 3, slits s4 and s5 are through holes penetrating the sensor element 3. The slits s4 and s5 are formed to reduce influence of stresses such as an external stress or a bonding stress.

As shown in FIG. 5A, the slit s4 is formed in the second part 632*a* of the supporter 63*a*. In other words, the slit s4 is formed in a part of the supporter 63*a* that is not bonded to the mount 22*d*.

By forming the slit s4, the stress such as the external stress or the bonding stress transmitted to the movable part 65 through the bonding part j61, the bonding part j62, or the lid 8 and the conductive member 85 can be reduced, and the acceleration Ay can be detected with higher accuracy.

As shown in FIG. 5B, the slit s5 is formed in the second part 632*b* of the supporter 63*b*. In other words, the slit s5 is formed in a part of the supporter 63*b* that is not bonded to the mount 22*f*.

By forming the slit s5, the stress such as the external stress or the bonding stress transmitted to the movable part 65 through the bonding part j61, the bonding part j63, or the lid 8 and the conductive member 85 can be reduced, and the acceleration Ay can be detected with higher accuracy.

As described above, since the sensor element 3 has the slits s4 and s5, it is possible to prevent changes in relative positions between the movable electrode 66*a* and the fixed electrode 96*a*, between the movable electrode 66*b* and the fixed electrode 96*b*, between the movable electrode 66*c* and the fixed electrode 96*c*, and between the movable electrode 66*d* and the fixed electrode 96*d* due to the stress such as the external stress or the bonding stress transmitted through the mount 22*e*, the mount 22*d*, the mount 22*f*, or the lid 8 and the conductive member 85.

Therefore, it is possible to prevent the change in the static capacitance between the movable electrode 66*a* and the fixed electrode 96*a*, between the movable electrode 66*b* and the fixed electrode 96*b*, between the movable electrode 66*c* and the fixed electrode 96*c*, and between the movable electrode 66*d* and the fixed electrode 96*d* in a natural state. Accordingly, the inertial sensor 1 can detect the acceleration Ay with higher accuracy.

1.4. Modifications

The above-described embodiment can be variously modified. Hereinafter, specific modifications will be exemplified.

Figure 6:
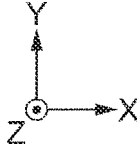
FIG. 6 is a plan view of an inertial sensor according to Modification 1.
Figure 7:
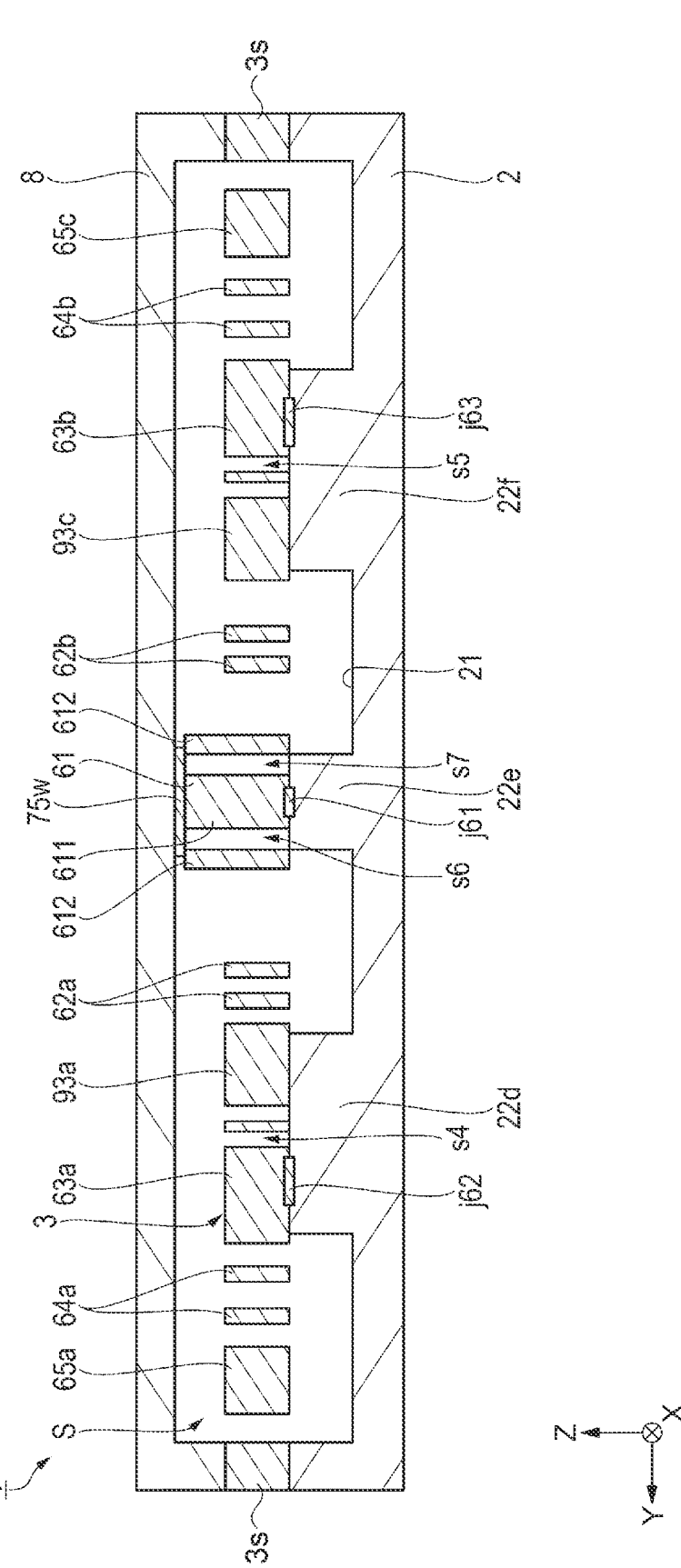
FIG. 7 is a cross-sectional view of the inertial sensor taken along a line F-F in FIG. 6.
Figure 8:
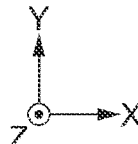
FIG. 8 is a plan view of an inertial sensor according to Modification 2.
Figure 9:
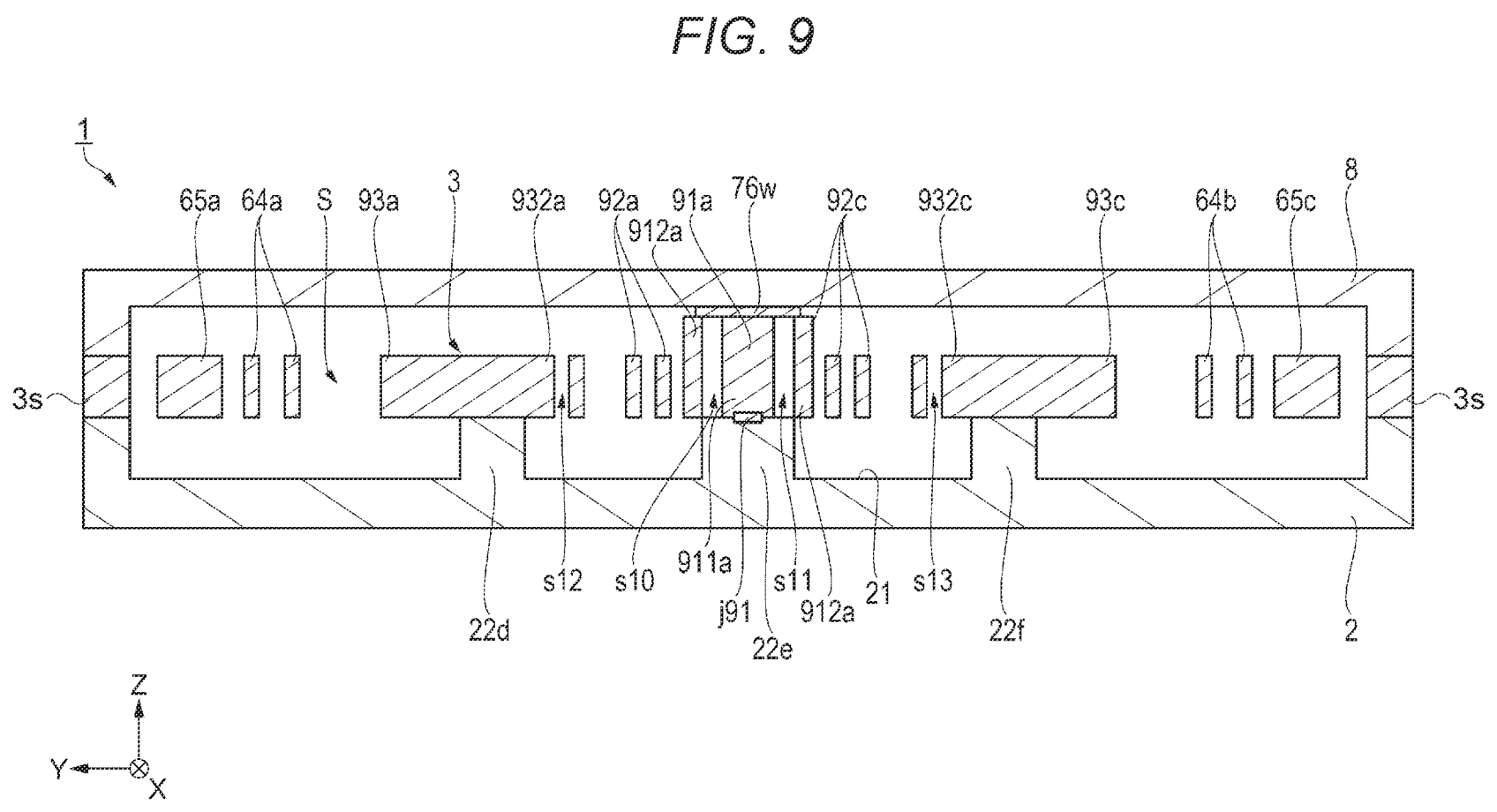
Figure 10:
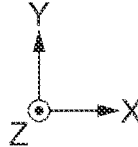
FIG. 10 is a plan view of an inertial sensor according to Modification 3.
Figure 11:
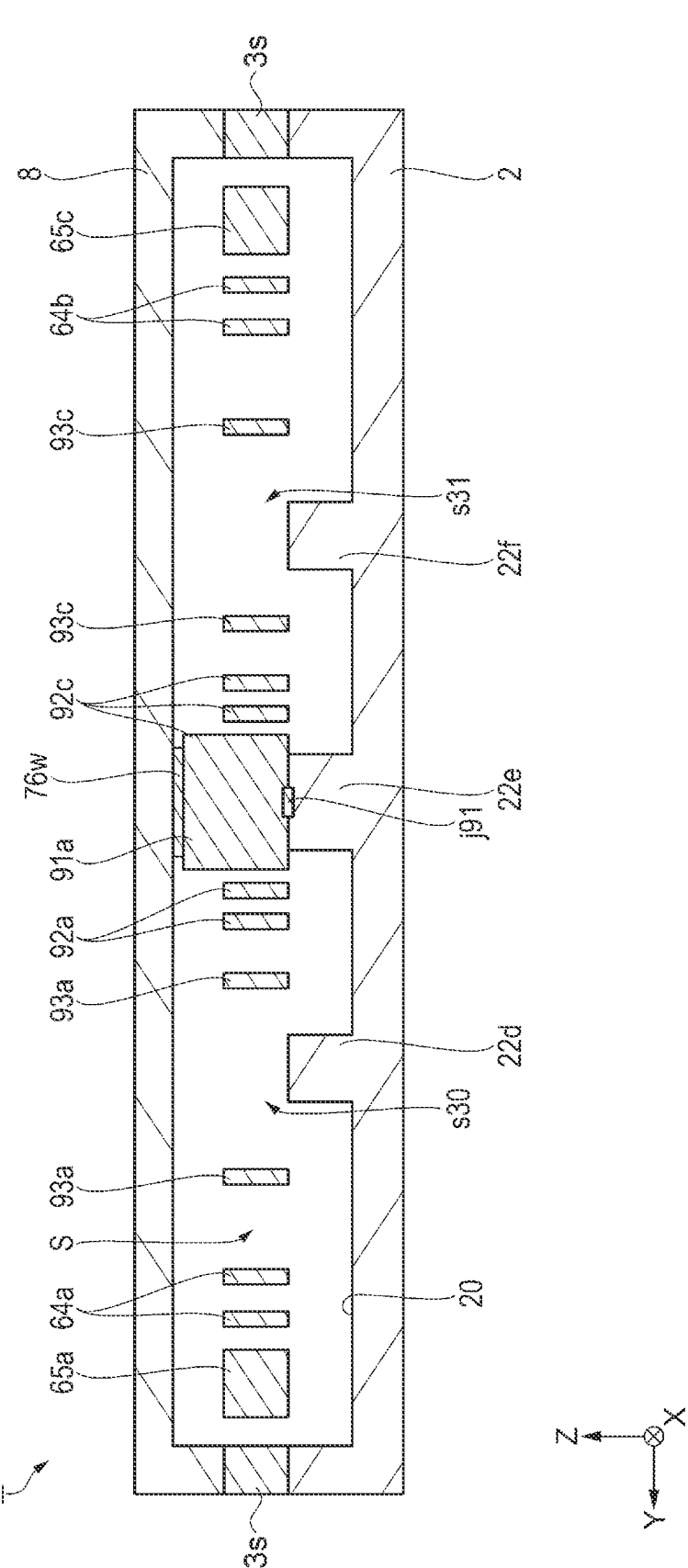
FIG. 11 is a cross-sectional view of the inertial sensor taken along a line H-H in FIG. 10.
Figure 12:
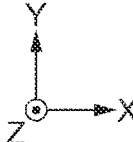
FIG. 12 is a plan view of an inertial sensor according to Modification 4.
Figure 13:
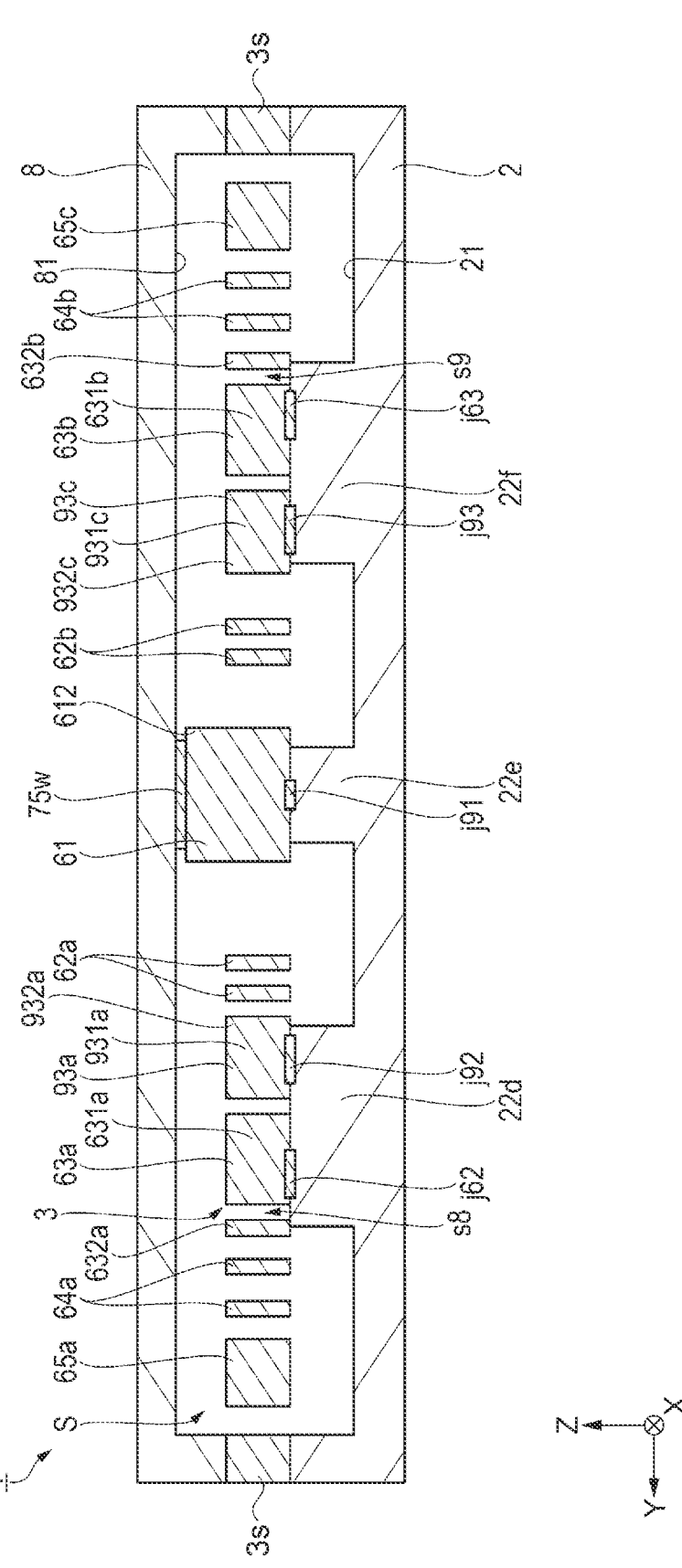
FIG. 13 is a cross-sectional view of the inertial sensor taken along a line I-I in FIG. 12.

FIG. 6 is a plan view showing an inertial sensor according to Modification 1 of the embodiment. FIG. 7 is a cross-sectional view of the inertial sensor taken along a line F-F in FIG. 6. FIG. 8 is a plan view showing an inertial sensor according to Modification 2 of the embodiment. FIG. 9 is a cross-sectional view of the inertial sensor taken along a line G-G in FIG. 8. FIG. 10 is a plan view showing an inertial sensor according to Modification 3 of the embodiment. FIG. 11 is a cross-sectional view of the inertial sensor taken along a line H-H in FIG. 10. FIG. 12 is a plan view showing an inertial sensor according to Modification 4 of the embodiment. FIG. 13 is a cross-sectional view of the inertial sensor taken along a line I-I in FIG. 12. In the following description, differences from Embodiment 1 will be mainly described, and the same components as those in Embodiment 1 are denoted by the same reference signs, and description thereof will be omitted.

1.4.1. Modification 1

As shown in FIG. 6, the inertial sensor 1 according to Modification 1 is different from the inertial sensor 1 according to the above-described embodiment in that slits s6 and s7 are formed in the conductor 61.

As shown in FIG. 7, slits s6 and s7 are through holes penetrating the sensor element 3. The slits s6 and s7 are formed to reduce influence of stresses such as an external stress or a bonding stress.

As shown in FIG. 6, the slit s6 is formed in the second part 612 between the wiring 62*a* and the first part 611 in the conductor 61. In other words, the slit s6 is formed in a part of the conductor 61 that is not bonded to the mount 22*e*.

By forming the slit s6, the stress such as the external stress or the bonding stress transmitted to the movable part 65 through the bonding part j61, or the lid 8 and the conductive member 85 can be reduced, and the acceleration Ay can be detected with higher accuracy.

The slit s7 is formed in the second part 612 between the wiring 62*b* and the first part 611 in the conductor 61. In other words, the slit s7 is formed in a part of the conductor 61 that is not bonded to the mount 22*e*.

By forming the slit s7, the stress such as the external stress or the bonding stress transmitted to the movable part 65 through the bonding part j61, or the lid 8 and the conductive member 85 can be reduced, and the acceleration Ay can be detected with higher accuracy.

The inertial sensor 1 according to Modification 1 has the slits s4, s5, s6, and s7, and may be modified to a configuration having only the slits s6 and s7.

In addition, shapes of the slits s4, s5, s6, and s7 may be other than a square prism. For example, the shape may be a cylinder or a triangular prism. In addition, the number of each of the slits s4, s5, s6, and s7 may be plural or may be formed in a plurality of rows along the Y-axis direction.

In addition, the slits s4, s5, s6, and s7 are preferably through holes penetrating the sensor element 3, and may be grooves with a bottom when the slits have a function of reducing the stress such as the external stress or the bonding stress.

1.4.2. Modification 2

As shown in FIG. 8, the inertial sensor 1 according to Modification 2 is different from the inertial sensor 1 according to the above-described embodiment in that slits s10 and s11 are formed in the conductor 91*a*, slits s20 and s21 are formed in the conductor 91*b*, a slit s12 is formed in the supporter 93*a*, a slit s22 is formed in the supporter 93*b*, a slit s13 is formed in the supporter 93*c*, and a slit s23 is formed in the supporter 93*d*.

As shown in FIG. 9, the slits s10, s11, s12, and s13 are through holes penetrating the sensor element 3. Although not shown, the slits s20, s21, s22, and s23 are also through holes penetrating the sensor element 3. The slits s10, s11, s12, s13, s20, s21, s22, and s23 are formed to reduce influence of stresses such as an external stress or a bonding stress.

As shown in FIG. 8, the slit s10 is formed in the second part 912*a* between the wiring 92*a* and the first part 911*a* in the conductor 91*a*. In other words, the slit s10 is formed in a part of the conductor 91*a* that is not bonded to the mount 22*e*.

By forming the slit s10, the stress such as the external stress or the bonding stress transmitted to the fixed electrode 96*a* through the bonding part j91, or the lid 8 and the conductive member 86 can be reduced, and the acceleration Ay can be detected with higher accuracy.

The slit s11 is formed in the second part 912*a* between the wiring 92*c* and the first part 911*a* in the conductor 91*a*. In other words, the slit s11 is formed in a part of the conductor 91*a* that is not bonded to the mount 22*e*.

By forming the slit s11, the stress such as the external stress or the bonding stress transmitted to the fixed electrode 96*c* through the bonding part j91, or the lid 8 and the conductive member 86 can be reduced, and the acceleration Ay can be detected with higher accuracy.

The slit s12 is formed in the second part 932*a* between the wiring 92*a* and the first part 931*a* in the supporter 93*a*. In other words, the slit s12 is formed in a part of the supporter 93*a* that is not bonded to the mount 22*d*. In addition, it can be said that the slit s12 is formed in a part protruding from the mount 22*d* in the supporter 93*a*.

By forming the slit s12, the stress such as the external stress or the bonding stress transmitted to the fixed electrode 96*a* through the bonding part j92, the bonding part j91, or the lid 8 and the conductive member 86 can be reduced, and the acceleration Ay can be detected with higher accuracy.

The slit s13 is formed in the second part 932*c* between the wiring 92*c* and the first part 931*c* in the supporter 93*c*. In other words, the slit s13 is formed in a part of the supporter 93*c* that is not bonded to the mount 22*f*. In addition, it can be said that the slit s13 is formed in a part protruding from the mount 22*f* in the supporter 93*c*.

By forming the slit s13, the stress such as the external stress or the bonding stress transmitted to the fixed electrode 96*c* through the bonding part j93, the bonding part j91, or the lid 8 and the conductive member 86 can be reduced, and the acceleration Ay can be detected with higher accuracy.

The slit s20 is formed in the second part 912*b* between the wiring 92*b* and the first part 911*b* in the conductor 91*b*. In other words, the slit s20 is formed in a part of the conductor 91*b* that is not bonded to the mount 22*e*.

By forming the slit s20, the stress such as the external stress or the bonding stress transmitted to the fixed electrode 96*b* through the bonding part j91, or the lid 8 and the conductive member 87 can be reduced, and the acceleration Ay can be detected with higher accuracy.

The slit s21 is formed in the second part 912*b* between the wiring 92*d* and the first part 911*b* in the conductor 91*b*. In other words, the slit s21 is formed in a part of the conductor 91*b* that is not bonded to the mount 22*e*.

By forming the slit s21, the stress such as the external stress or the bonding stress transmitted to the fixed electrode 96*d* through the bonding part j91, or the lid 8 and the conductive member 87 can be reduced, and the acceleration Ay can be detected with higher accuracy.

The slit s22 is formed in the second part 932*b* between the wiring 92*b* and the first part 931*b* in the supporter 93*b*. In other words, the slit s22 is formed in a part of the supporter 93*b* that is not bonded to the mount 22*d*. In addition, it can be said that the slit s22 is formed in a part protruding from the mount 22*d* in the supporter 93*b*.

By forming the slit s22, the stress such as the external stress or the bonding stress transmitted to the fixed electrode 96*b* through the bonding part j92, the bonding part j91, or the lid 8 and the conductive member 87 can be reduced, and the acceleration Ay can be detected with higher accuracy.

The slit s23 is formed in the second part 932*d* between the wiring 92*d* and the first part 931*d* in the supporter 93*d*. In other words, the slit s23 is formed in a part of the supporter 93*d* that is not bonded to the mount 22*f*. In addition, it can be said that the slit s23 is formed in a part protruding from the mount 22*f* in the supporter 93*d*.

By forming the slit s23, the stress such as the external stress or the bonding stress transmitted to the fixed electrode 96*d* through the bonding part j93, the bonding part j91, or the lid 8 and the conductive member 87 can be reduced, and the acceleration Ay can be detected with higher accuracy.

The inertial sensor 1 according to Modification 2 has the slits s10, s11, s12, s13, s20, s21, s22, and s23, and may be modified to a configuration having only the slits s10, s11, s20, and s21. In addition, the inertial sensor 1 according to Modification 2 may be modified to a configuration having only the slits s12, s13, s22, and s23. In addition, Modification 2 may be modified to a configuration combined with Embodiment 1 or Modification 1.

In addition, the slits s10, s11, s12, s13, s20, s21, s22, and s23 may have a shape other than a square prism. For example, the shape may be a cylinder or a triangular prism. In addition, the number of each of the slits s10, s11, s12, s13, s20, s21, s22, and s23 may be plural, and the slits may be formed in a plurality of rows along the Y-axis direction.

In addition, the slits s10, s11, s12, s13, s20, s21, s22, and s23 are preferably through holes penetrating the sensor element 3, and may be grooves with a bottom when the slits have a function of reducing the stress such as the external stress or the bonding stress.

1.4.3. Modification 3

As shown in FIG. 10, the inertial sensor 1 according to Modification 3 is different from the inertial sensor 1 according to the above-described embodiment in that a slit s30 is formed in the supporter 93*a*, a slit s31 is formed in the supporter 93*c*, a slit s32 is formed in the supporter 93*b*, and a slit s33 is formed in the supporter 93*d*.

As shown in FIG. 11, the slits s30 and s31 are through holes penetrating the sensor element 3. Although not shown, the slits s32 and s33 are also through holes penetrating the sensor element 3. The slits s30, s31, s32, and s33 are formed to reduce influence of stresses such as an external stress or a bonding stress.

As shown in FIG. 10, the slit s30 is formed in the second part 932*a* between the fixed electrode 96*a* and the first part 931*a* in the supporter 93*a*. In other words, the slit s30 is formed in a part of the supporter 93*a* that is not bonded to the mount 22*d*. In addition, it can be said that the slit s30 is formed in a part protruding from the mount 22*d* in the supporter 93*a*.

By forming the slit s30, the stress such as the external stress or the bonding stress transmitted to the fixed electrode 96*a* through the bonding part j92, the bonding part j91, or the lid 8 and the conductive member 86 can be reduced, and the acceleration Ay can be detected with higher accuracy.

The slit s31 is formed in the second part 932c between the fixed electrode 96c and the first part 931c in the supporter 93c. In other words, the slit s31 is formed in a part of the supporter 93c that is not bonded to the mount 22f. In addition, it can be said that the slit s31 is formed in a part protruding from the mount 22f in the supporter 93c.

By forming the slit s31, the stress such as the external stress or the bonding stress transmitted to the fixed electrode 96c through the bonding part j93, the bonding part j91, or the lid 8 and the conductive member 86 can be reduced, and the acceleration Ay can be detected with higher accuracy.

The slit s32 is formed in the second part 932b between the fixed electrode 96b and the first part 931b in the supporter 93b. In other words, the slit s32 is formed in a part of the supporter 93b that is not bonded to the mount 22d. In addition, it can be said that the slit s32 is formed in a part protruding from the mount 22d in the supporter 93b.

By forming the slit s32, the stress such as the external stress or the bonding stress transmitted to the fixed electrode 96b through the bonding part j92, the bonding part j91, or the lid 8 and the conductive member 87 can be reduced, and the acceleration Ay can be detected with higher accuracy.

The slit s33 is formed in the second part 932d between the fixed electrode 96d and the first part 931d in the supporter 93d. In other words, the slit s33 is formed in a part of the supporter 93d that is not bonded to the mount 22f. In addition, it can be said that the slit s33 is formed in a part protruding from the mount 22f in the supporter 93d.

By forming the slit s33, the stress such as the external stress or the bonding stress transmitted to the fixed electrode 96d through the bonding part j93, the bonding part j91, or the lid 8 and the conductive member 87 can be reduced, and the acceleration Ay can be detected with higher accuracy.

The inertial sensor 1 according to Modification 3 may be modified to a configuration combined with Embodiment 1, Modification 1, or Embodiment 2. For example, the slits s10, s11, s20, and s21 may be further formed. In addition, the slits s10, s11, s12, s13, s20, s21, s22, and s23 may be further formed.

In addition, shapes of the slits s30, s31, s32, and s33 may be other than a square prism. For example, the shape may be a cylinder or a triangular prism. In addition, the number of each of the slits s30, s31, s32, and s33 may be plural, and the slits may be formed in a plurality of rows along the X-axis direction.

In addition, the slits s30, s31, s32, and s33 are preferably through holes penetrating the sensor element 3, and may be grooves with a bottom when the slits have a function of reducing the stress such as the external stress or the bonding stress.

1.4.4. Modification 4

As shown in FIG. 12, the inertial sensor 1 according to Modification 4 is different from the inertial sensor 1 according to the above-described embodiment in that a slit s8 is formed in the supporter 63a and a slit s9 is formed in the supporter 63b.

As shown in FIG. 13, the slits s8 and s9 are through holes penetrating the sensor element 3. The slits s8 and s9 are formed to reduce influence of stresses such as an external stress or a bonding stress.

As shown in FIG. 12, the slit s8 is formed in the second part 632a between the spring 64a and the first part 631a in the supporter 63a. In other words, the slit s8 is formed in a part of the supporter 63a that is not bonded to the mount 22d.

By forming the slit s8, the stress such as the external stress or the bonding stress transmitted to the movable part 65 through the bonding part j61, the bonding part j62, or the lid 8 and the conductive member 85 can be reduced, and the acceleration Ay can be detected with higher accuracy.

The slit s9 is formed in the second part 632b between the spring 64b and the first part 631b in the supporter 63b. In other words, the slit s9 is formed in a part of the supporter 63b that is not bonded to the mount 22f.

By forming the slit s9, the stress such as the external stress or the bonding stress transmitted to the movable part 65 through the bonding part j61, the bonding part j63, or the lid 8 and the conductive member 85 can be reduced, and the acceleration Ay can be detected with higher accuracy.

The inertial sensor 1 according to Modification 4 has the slits s8 and s9, and may be modified to a configuration combined with Embodiment 1, Modification 1, Modification 2, or Modification 3. For example, the slits s4 and s5 may be further formed.

In addition, shapes of the slits s8 and s9 may be other than a square prism. For example, the shape may be a cylinder or a triangular prism. In addition, the number of each of the slits s8 and s9 may be plural, and the slits may be formed in a plurality of rows along the Y-axis direction.

In addition, the slits s8 and s9 are preferably through holes penetrating the sensor element 3, and may be grooves with a bottom when the slits have a function of reducing the stress such as the external stress or the bonding stress.

The above-described inertial sensor 1 is an acceleration sensor capable of detecting the acceleration Ay in the Y-axis direction, and the inertial sensor 1 according to the embodiment can also be applied to an acceleration sensor capable of detecting the acceleration in the X-axis direction. In addition, the inertial sensor 1 according to the embodiment can also be applied to an acceleration sensor capable of detecting an acceleration in the Z-axis direction. In addition, the inertial sensor 1 according to the embodiment can also be applied to an angular velocity sensor that detects an angular velocity.

As described above, according to the inertial sensor 1 in the embodiment, the following effects can be attained.

The inertial sensor 1 according to the embodiment includes the base 2 as a substrate having the mount 22e as a first mount and the mount 22d as a second mount, the lid 8 as a lid that faces the base 2 and that includes the conductive member 85 electrically coupling the base 2 side and the opposite side from the base 2, and the sensor element 3 provided between the base 2 and the lid 8, the base 2 side of the sensor element 3 being bonded to the mount 22e and the mount 22d, the lid 8 side of the sensor element 3 being coupled to the conductive member 85. The sensor element 3 includes the conductor 61 as a first coupling part bonded to the mount 22e through the bonding part j61 serving as a first bonding part and coupled to the conductive member 85, the movable electrode 66 as an electrode including the electrode fingers 661 electrically coupled to the conductor 61, the supporter 63a as a second coupling part provided between the movable electrode 66 and the conductor 61 and bonded to the mount 22d through the bonding part j62 serving as a second bonding part, and the wiring 62a provided between the conductor 61 and the supporter 63a. The supporter 63a includes, in a plan view, the first part 631a of the supporter 63a overlapping the bonding part j62, and the second part 632a of the supporter 63a not overlapping the bonding part j62. The second part 632a of the supporter 63a has the slit s4 or the slit s8 as a first through hole.

In this way, since the slit s4 or the slit s8 is formed in the second part 632*a* of the supporter 63*a*, it is possible to reduce influence of a stress transmitted to the movable electrode 66 through the bonding part j61, the bonding part j62, and/or the conductive member 85, and it is possible to implement the inertial sensor 1 of high quality with little deterioration in detection accuracy.

In the inertial sensor 1 according to the embodiment, the conductor 61 serving as the first coupling part includes, in a plan view, the first part 611 of the conductor 61 overlapping the bonding part j61 serving as the first bonding part and the second part 612 of the conductor 61 not overlapping the bonding part j61, and the second part 612 of the conductor 61 has the slit s6 as a second through hole.

In this way, since the slit s6 is formed in the second part 612 of the conductor 61, it is possible to reduce the influence of the stress transmitted to the movable electrode 66 through the bonding part j61 and/or the conductive member 85, and it is possible to implement the inertial sensor 1 of high quality with little deterioration in detection accuracy.

In the inertial sensor 1 according to the embodiment, the slit s4 serving as the first through hole is formed between the first part 631*a* of the supporter 63*a* serving as the second coupling part and the wiring 62*a*.

In this way, since the slit s4 is formed between the first part 631*a* of the supporter 63*a* and the wiring 62*a*, it is possible to reduce the influence of the stress transmitted to the movable electrode 66 through the bonding part j61 and/or the conductive member 85, and it is possible to implement the inertial sensor 1 of high quality with little deterioration in detection accuracy.

In the inertial sensor 1 according to the embodiment, the slit s8 serving as the first through hole is formed between the bonding part j62 serving as the second bonding part and the movable electrode 66.

In this way, since the slit s8 is formed between the bonding part j62 and the movable electrode 66, it is possible to reduce the influence of the stress transmitted to the movable electrode 66 through the bonding part j61, the bonding part j62, and/or the conductive member 85, and it is possible to implement the inertial sensor 1 of high quality with little deterioration in detection accuracy.

The inertial sensor 1 according to the embodiment includes the base 2 as a substrate including the mount 22*e* as a first mount and the mount 22*d* as a second mount, the lid 8 as a lid that faces the base 2 and that includes the conductive member 86 electrically coupling the base 2 side and the opposite side from the base 2, and the sensor element 3 provided between the base 2 and the lid 8 and, the base 2 side of the sensor element 3 being bonded to the mount 22*e* and the mount 22*d*, the lid 8 side of the sensor element 3 being coupled to the conductive member 86. The sensor element 3 includes the conductor 91*a* as a first coupling part bonded to the mount 22*e* through the bonding part j91 serving as a first bonding part and coupled to the conductive member 86, the fixed electrode 96 as an electrode including the electrode fingers 961 electrically coupled to the conductor 91*a*, the supporter 93*a* as a second coupling part provided between the fixed electrode 96 and the conductor 91*a* and bonded to the mount 22*d* through the bonding part j92 serving as a second bonding part, and the wiring 92*a* provided between the conductor 91*a* and the supporter 93*a*. The supporter 93*a* includes, in a plan view, the first part 931*a* of the supporter 93*a* overlapping the bonding part j92, and the second part 932*a* of the supporter 93*a* not overlapping the bonding part j92. The second part 932*a* of the supporter 93*a* has the slit s12 or the slit s30 as a first through hole.

In this way, since the slit s12 or the slit s30 is formed in the second part 932*a* of the supporter 93*a*, it is possible to reduce influence of a stress transmitted to the fixed electrode 96 through the bonding part j91, the bonding part j92, and/or the conductive member 86, and it is possible to implement the inertial sensor 1 of high quality with little deterioration in detection accuracy.

In the inertial sensor 1 according to the embodiment, the conductor 91*a* serving as the first coupling part includes, in a plan view, the first part 911*a* of the conductor 91*a* overlapping the bonding part j91 serving as the first bonding part and the second part 912*a* of the conductor 91*a* not overlapping the bonding part j91, and the second part 912*a* of the conductor 91*a* has the slit s10 as a second through hole.

In this way, since the slit s10 is formed in the second part 912*a* of the conductor 91*a*, it is possible to reduce the influence of the stress transmitted to the fixed electrode 96 through the bonding part j91 and/or the conductive member 86, and it is possible to implement the inertial sensor 1 of high quality with little deterioration in detection accuracy.

In the inertial sensor 1 according to the embodiment, the slit s12 serving as the first through hole is formed between the bonding part j92 serving as the second bonding part and the wiring 92*a*.

In this way, since the slit s12 is formed between the bonding part j92 and the wiring 92*a*, it is possible to reduce the influence of the stress transmitted to the fixed electrode 96 through the bonding part j91 and/or the conductive member 86, and it is possible to implement the inertial sensor 1 of high quality with little deterioration in detection accuracy.

In the inertial sensor 1 according to the embodiment, the slit s30 serving as the first through hole is formed between the bonding part j92 serving as the second bonding part and the fixed electrode 96*a*.

In this way, since the slit s30 is formed between the bonding part j92 and the fixed electrode 96*a*, it is possible to reduce the influence of the stress transmitted to the fixed electrode 96 through the bonding part j91, the bonding part j92, and/or the conductive member 86, and it is possible to implement the inertial sensor 1 of high quality with little deterioration in detection accuracy.

The inertial sensor 1 according to the embodiment includes the base 2 as a substrate including the mount 22*e* as a first mount and the mount 22*d* as a second mount, the lid 8 as a lid that faces the base 2 and that includes the conductive member 85 electrically coupling the base 2 side and the opposite side from the base 2, and the sensor element 3 provided between the base 2 and the lid 8, the base 2 side of the sensor element 3 being bonded to the mount 22*e* and the mount 22*d*, the lid 8 side of the sensor element 3 being coupled to the conductive member 85. The sensor element 3 includes the conductor 61 as a first coupling part bonded to the mount 22*e* through the bonding part j61 serving as a first bonding part and coupled to the conductive member 85, the movable electrode 66 as an electrode including the electrode fingers 661 electrically coupled to the conductor 61, the supporter 63*a* as a second coupling part provided between the movable electrode 66 and the conductor 61 and bonded to the mount 22*d* through the bonding part j62 serving as a second bonding part, and the wiring 62*a* provided between the conductor 61 and the supporter 63*a*. The conductor 61 includes, in a plan view, the first part 611 of the conductor

61 overlapping the bonding part j61 and the second part 612 of the conductor 61 not overlapping the bonding part j61. The second part 612 of the conductor 61 has the slit s6 as a through hole.

In this way, since the slit s6 is formed in the second part 612 of the conductor 61, it is possible to reduce the influence of the stress transmitted to the movable electrode 66 through the bonding part j61, the bonding part j62, and/or the conductive member 85, and it is possible to implement the inertial sensor 1 of high quality with little deterioration in detection accuracy.

The inertial sensor 1 according to the embodiment includes the base 2 as a substrate including the mount 22*e* as a first mount and the mount 22*d* as a second mount, the lid 8 as a lid that faces the base 2 and that includes the conductive member 86 electrically coupling the base 2 side and the opposite side from the base 2, and the sensor element 3 provided between the base 2 and the lid 8, the base 2 side of the sensor element 3 being bonded to the mount 22*e* and the mount 22*d*, the lid 8 side of the sensor element 3 being coupled to the conductive member 86. The sensor element 3 includes the conductor 91*a* as a first coupling part bonded to the mount 22*e* through the bonding part j91 serving as a first bonding part and coupled to the conductive member 86, the fixed electrode 96 as an electrode including the electrode fingers 961 electrically coupled to the conductor 91*a*, the supporter 93*a* as a second coupling part provided between the fixed electrode 96 and the conductor 91*a* and bonded to the mount 22*d* through the bonding part j92 serving as a second bonding part, and the wiring 92*a* provided between the conductor 91*a* and the supporter 93*a*. The conductor 91*a* includes, in a plan view, the first part 911*a* of the conductor 91*a* overlapping the bonding part j91, and the second part 912*a* of the conductor 91*a* not overlapping the bonding part j91. The second part 912*a* of the conductor 91*a* has the slit s10 as a through hole.

In this way, since the slit s10 is formed in the second part 912*a* of the conductor 91*a*, it is possible to reduce the influence of the stress transmitted to the fixed electrode 96 through the bonding part j91, the bonding part j92, and/or the conductive member 86, and it is possible to implement the inertial sensor 1 of high quality with little deterioration in detection accuracy.

The inertial sensor 1 according to the embodiment includes the base 2 as a substrate including the mount 22*e* as a first mount, the mount 22*d* as a second mount, and the mount 22*f* as a third mount, the lid 8 as a lid that faces the base 2 and that includes the conductive member 85 electrically coupling the base 2 side and the opposite side from the base 2, and the sensor element 3 provided between the base 2 and the lid 8, the base 2 side of the sensor element 3 being bonded to the mount 22*e*, the mount 22*d*, and the mount 22*f*, the lid 8 side of the sensor element 3 being coupled to the conductive member 85. The mount 22*e*, the mount 22*d*, and the mount 22*f* are provided in the order of the mount 22*f*, the mount 22*e*, and the mount 22*d* along a plus side in the Y-axis direction serving as a first direction. The sensor element 3 includes the conductor 61 as a first coupling part bonded to the mount 22*e* through the bonding part j61 serving as a first bonding part and coupled to the conductive member 85, the movable electrode 66 as an electrode including the electrode fingers 661 electrically coupled to the conductor 61, the supporter 63*a* as a second coupling part provided between the movable electrode 66 and the conductor 61 and bonded to the mount 22*d* through the bonding part j62 serving as a second bonding part, the wiring 62*a* as a first wiring provided between the conductor 61 and the supporter 63*a*, the supporter 63*b* as a third coupling part provided between the movable electrode 66 and the conductor 61 and bonded to the mount 22*f* through the bonding part j63 serving as a third bonding part, and the wiring 62*b* as a second wiring provided between the conductor 61 and the supporter 63*b*. The supporter 63*a* includes, in a plan view, the first part 631*a* of the supporter 63*a* overlapping the bonding part j62, and a second part 632*a* of the supporter 63*a* not overlapping the bonding part j62. The second part 632*a* of the supporter 63*a* has the slit s4 as a first through hole. The supporter 63*b* includes, in a plan view, the first part 631*b* of the supporter 63*b* overlapping the bonding part j63, and the second part 632*b* of the supporter 63*b* not overlapping the bonding part j63. The second part 632*b* of the supporter 63*b* has the slit s5 as a second through hole.

In this way, since the slit s4 is formed in the second part 632*a* of the supporter 63*a*, it is possible to reduce influence of a stress transmitted to the movable electrode 66 through the bonding part j61, the bonding part j62, and/or the conductive member 85. In addition, since the slit s5 is formed in the second part 632*b* of the supporter 63*b*, it is possible to reduce influence of a stress transmitted to the movable electrode 66 through the bonding part j61, the bonding part j63, and/or the conductive member 85. Therefore, it is possible to implement the inertial sensor 1 of high quality with little deterioration in detection accuracy.

In the inertial sensor 1 according to the embodiment, the conductor 61 serving as the first coupling part includes, in a plan view, the first part 611 of the conductor 61 overlapping the bonding part j61 serving as the first bonding part and the second part 612 of the conductor 61 not overlapping the bonding part j61, and the second part 612 of the conductor 61 has the slit s6 as a third through hole between the wiring 62*a* and the second part 612 of the conductor 61, and has the slit s7 as a fourth through hole between the wiring 62*b* and the second part 612 of the conductor 61.

In this way, since the slit s6 is formed between the wiring 62*a* and the second part 612 of the conductor 61, it is possible to reduce influence of a stress transmitted to the movable electrode 66 through the bonding part j61, the bonding part j62, and/or the conductive member 85. In addition, since the slit s7 is formed between the wiring 62*b* and the second part 612 of the conductor 61, it is possible to reduce influence of a stress transmitted to the movable electrode 66 through the bonding part j61, the bonding part j63, and/or the conductive member 85. Therefore, it is possible to implement the inertial sensor 1 of high quality with little deterioration in detection accuracy.

The inertial sensor 1 according to the embodiment includes the base 2 as a substrate including the mount 22*e* as a first mount, the mount 22*d* as a second mount, and the mount 22*f* as a third mount, the lid 8 as a lid that faces the base 2 and that includes the conductive member 85 electrically coupling the base 2 side and the opposite side from the base 2, and the sensor element 3 provided between the base 2 and the lid 8, the base 2 side of the sensor element 3 being bonded to the mount 22*e*, the mount 22*d*, and the mount 22*f*, the lid 8 side of the sensor element 3 being coupled to the conductive member 86. The mount 22*e*, the mount 22*d*, and the mount 22*f* are provided in the order of the mount 22*f*, the mount 22*e*, and the mount 22*d* along a plus side in the Y-axis direction serving as a first direction. The sensor element 3 includes the conductor 91*a* as a first coupling part bonded to the mount 22*e* through the bonding part j91 as a first bonding part and coupled to the conductive member 86, the fixed electrode 96 as an electrode including the electrode fingers 961 electrically coupled to the conductor 91*a*, the supporter 93*a* as a second coupling part provided between the fixed electrode 96 and the conductor 91*a* and bonded to the mount 22*d* through the bonding part j92 as a second bonding part, the wiring 92*a* as a first wiring provided between the conductor 91*a* and the supporter 93*a*, the supporter 93*c* as a third coupling part provided between the fixed electrode 96 and the conductor 91*a* and bonded to the mount 22*f* through the bonding part j93 as a third bonding part, and the wiring 92*c* as a second wiring provided between the conductor 91*a* and the supporter 93*c*. The supporter 93*a* includes, in a plan view, the first part 931*a* of the supporter 93*a* overlapping the bonding part j92, and the second part 932*a* of the supporter 93*a* not overlapping the bonding part j92. The second part 932*a* of the supporter 93*a* has the slit s12 or the slit s30 as a first through hole. The supporter 93*c* includes, in the plan view, the first part 931*c* of the supporter 93*c* overlapping the bonding part j93, and the second part 932*c* of the supporter 93*c* not overlapping the bonding part j93. The second part 932*c* of the supporter 93*c* has the slit s13 or the slit s31 as a second through hole.

In this way, since the slit s12 or the slit s30 is formed in the second part 932*a* of the supporter 93*a*, it is possible to reduce influence of a stress transmitted to the fixed electrode 96 through the bonding part j91, the bonding part j92, and/or the conductive member 86. In addition, since the slit s13 or the slit s31 is formed in the second part 932*c* of the supporter 93*c*, it is possible to reduce influence of a stress transmitted to the fixed electrode 96 through the bonding part j91, the bonding part j93, and/or the conductive member 86. Therefore, it is possible to implement the inertial sensor 1 of high quality with little deterioration in detection accuracy.

In the inertial sensor 1 according to the embodiment, the conductor 91*a* serving as the first coupling part includes, in a plan view, the first part 911*a* of the conductor 91*a* overlapping the bonding part j91 serving as the first bonding part and the second part 912*a* of the conductor 91*a* not overlapping the bonding part j91, and the second part 912*a* of the conductor 91*a* has the slit s10 as a third through hole between the wiring 92*a* and the second part 912*a* of the conductor 91*a*, and has the slit s11 as a fourth through hole between the wiring 92*c* and the second part 912*a* of the conductor 91*a*.

In this way, since the slit s10 is formed between the wiring 92*a* and the second part 912*a* of the conductor 91*a*, it is possible to reduce influence of a stress transmitted to the fixed electrode 96 through the bonding part j91, the bonding part j92, and/or the conductive member 86. In addition, since the slit s11 is formed between the wiring 92*c* and the second part 912*a* of the conductor 91*a*, it is possible to reduce influence of a stress transmitted to the fixed electrode 96 through the bonding part j91, the bonding part j93, and/or the conductive member 86. Therefore, it is possible to implement the inertial sensor 1 of high quality with little deterioration in detection accuracy.

The inertial sensor 1 according to the embodiment includes the base 2 as a substrate including the mount 22*e* as a first mount, the mount 22*d* as a second mount, and the mount 22*f* as a third mount, the lid 8 as a lid that faces the base 2 and that includes the conductive member 85 electrically coupling the base 2 side and the opposite side from the base 2, and the sensor element 3 provided between the base 2 and the lid 8, the base 2 side of the sensor element 3 being bonded to the mount 22*e*, the mount 22*d*, and the mount 22*f*, the lid 8 side of the sensor element 3 being coupled to the conductive member 85. The mount 22*e*, the mount 22*d*, and the mount 22*f* are provided in the order of the mount 22*f*, the mount 22*e*, and the mount 22*d* along a plus side in the Y-axis direction serving as a first direction. The sensor element 3 includes the conductor 61 as a first coupling part bonded to the mount 22*e* through the bonding part j61 as a first bonding part and coupled to the conductive member 85, the movable electrode 66 as an electrode including the electrode fingers 661 electrically coupled to the conductor 61, the supporter 63*a* as a second coupling part provided between the movable electrode 66 and the conductor 61 and bonded to the mount 22*d* through the bonding part j62 as a second bonding part, the wiring 62*a* as a first wiring provided between the conductor 61 and the supporter 63*a*, the supporter 63*b* as a third coupling part provided between the movable electrode 66 and the conductor 61 and bonded to the mount 22*f* through the bonding part j63 as a third bonding part, and the wiring 62*b* as a second wiring provided between the conductor 61 and the supporter 63*b*. The supporter 63*a* includes, in a plan view, the first part 631*a* of the supporter 63*a* overlapping the bonding part j62, and the second part 632*a* of the supporter 63*a* not overlapping the bonding part j62. The second part 612 of the conductor 61 has the slit s6 as a first through hole between the wiring 62*a* and the second part 612 of the conductor 61, and has the slit s7 as a second through hole between the wiring 62*b* and the second part 612 of the conductor 61.

In this way, since the slit s6 is formed between the wiring 62*a* and the second part 612 of the conductor 61, it is possible to reduce influence of a stress transmitted to the movable electrode 66 through the bonding part j61, the bonding part j62, and/or the conductive member 85. In addition, since the slit s7 is formed between the wiring 62*b* and the second part 612 of the conductor 61, it is possible to reduce influence of a stress transmitted to the movable electrode 66 through the bonding part j61, the bonding part j63, and/or the conductive member 85. Therefore, it is possible to implement the inertial sensor 1 of high quality with little deterioration in detection accuracy.

The inertial sensor 1 according to the embodiment includes the base 2 as a substrate including the mount 22*e* as a first mount, the mount 22*d* as a second mount, and the mount 22*f* as a third mount, the lid 8 as a lid that faces the base 2 and that includes the conductive member 85 electrically coupling the base 2 side and the opposite side from the base 2, and the sensor element 3 provided between the base 2 and the lid 8, the base 2 side of the sensor element 3 being bonded to the mount 22*e*, the mount 22*d*, and the mount 22*f*, the lid 8 side of the sensor element 3 being coupled to the conductive member 86. The mount 22*e*, the mount 22*d*, and the mount 22*f* are provided in the order of the mount 22*f*, the mount 22*e*, and the mount 22*d* along a plus side in the Y-axis direction as a first direction. The sensor element 3 includes the conductor 91*a* as a first coupling part bonded to the mount 22*e* through the bonding part j91 serving as a first bonding part and coupled to the conductive member 86, the fixed electrode 96 as an electrode including the electrode fingers 961 electrically coupled to the conductor 91*a*, the supporter 93*a* as a second coupling part provided between the fixed electrode 96 and the conductor 91*a* and bonded to the mount 22*d* through the bonding part j92 serving as a second bonding part, the wiring 92*a* as a first wiring provided between the conductor 91*a* and the supporter 93*a*, the supporter 93*c* as a third coupling part provided between the fixed electrode 96 and the conductor 91*a* and bonded to the mount 22*f* through the bonding part j93 serving as a third bonding part, and the wiring 92*c* as a second wiring provided between the conductor 91*a* and the supporter 93*c*. The conductor 91*a* includes, in a plan view, the first part 911*a* of the conductor 91*a* overlapping the bonding part j91, and the second part 912a of the conductor 91a not overlapping the bonding part j91. The second part 912a of the conductor 91a has the slit s10 as a first through hole between the wiring 92a and the second part 912a of the conductor 91a, and has the slit s11 as a second through hole between the wiring 92c and the second part 912a of the conductor 91a.

In this way, since the slit s10 is formed between the wiring 92a and the second part 912a of the conductor 91a, it is possible to reduce influence of a stress transmitted to the fixed electrode 96 through the bonding part j91, the bonding part j92, and/or the conductive member 86. In addition, since the slit s11 is formed between the wiring 92c and the second part 912a of the conductor 91a, it is possible to reduce influence of a stress transmitted to the fixed electrode 96 through the bonding part j91, the bonding part j93, and/or the conductive member 86. Therefore, it is possible to implement the inertial sensor 1 of high quality with little deterioration in detection accuracy.

In this way, since the slit s6 is formed between the wiring 62a and the second part 612 of the conductor 61, it is possible to reduce influence of a stress transmitted to the movable electrode 66 through the bonding part j61, the bonding part j62, and/or the conductive member 85. In addition, since the slit s7 is formed between the wiring 62b and the second part 612 of the conductor 61, it is possible to reduce influence of a stress transmitted to the movable electrode 66 through the bonding part j61, the bonding part j63, and/or the conductive member 85. Therefore, it is possible to implement the inertial sensor 1 of high quality with little deterioration in detection accuracy.

2. Embodiment 2

2.1. Overview of Inertial Measurement Unit

Next, an inertial measurement unit 2000 including the inertial sensor 1 will be described with reference to FIGS. 14 and 15.

Figure 14:
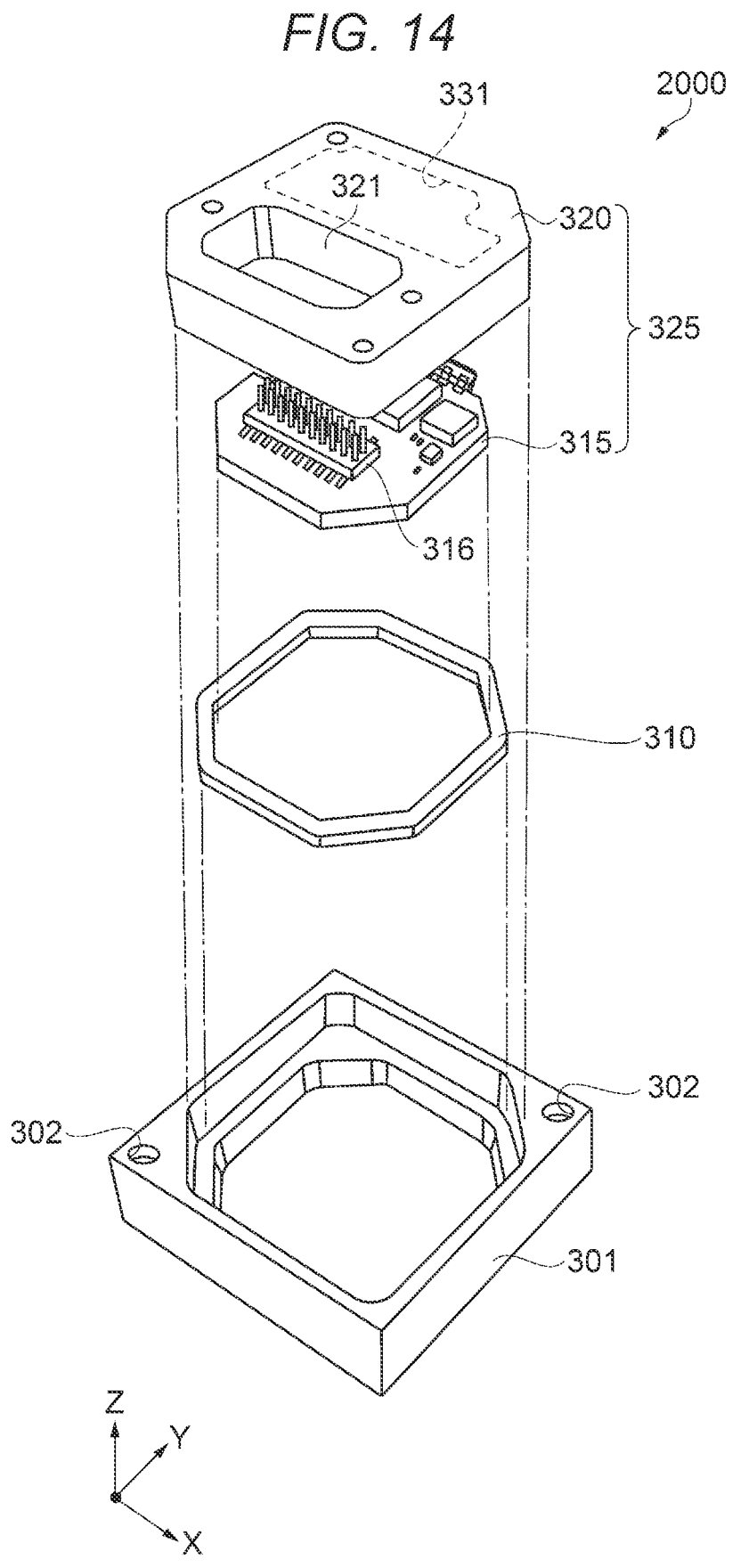

FIG. 14 is an exploded perspective view showing a schematic configuration of an inertial measurement unit (IMU) according to the embodiment. FIG. 15 is a perspective view of a substrate mounted on the inertial measurement unit and on which the inertial sensor is mounted.

The inertial measurement unit 2000 is mounted on a device to be mounted such as an automatic vehicle, a robot, a smartphone, or a portable activity meter, and is used as a device that detects a posture, a behavior, or the like of the device to be mounted.

As shown in FIG. 14, the inertial measurement unit 2000 includes an outer case 301, a bonding member 310, and a sensor module 325. The sensor module 325 is fitted or inserted into the outer case 301 with the bonding member 310 interposed therebetween.

The outer case 301 is a box-shaped container having a rectangular-parallelepiped outer shape without a lid, and an inside thereof is an internal space surrounded by a wall. A material of the outer case 301 is, for example, aluminum. Other metals such as zinc and stainless steel, resins, and composite materials of metals and resins may be used.

Through holes 302 are formed near two vertices located in a diagonal line direction on an upper surface of the outer case 301. The through hole 302 is used when attaching the inertial measurement unit 2000 to the device to be mounted.

The sensor module 325 includes an inner case 320 and a circuit board 315.

The inner case 320 is a member that supports the circuit board 315, and has a shape that is accommodated inside the outer case 301. A material of the inner case 320 may be the same as that of the outer case 301.

A recess 331 for preventing contact with the circuit board 315 and an opening 321 for exposing a connector 316 are formed in a lower surface of the inner case 320.

A configuration of the circuit board 315 on which the inertial sensor 1 is mounted will be described with reference to FIG. 15.

Figure 15:
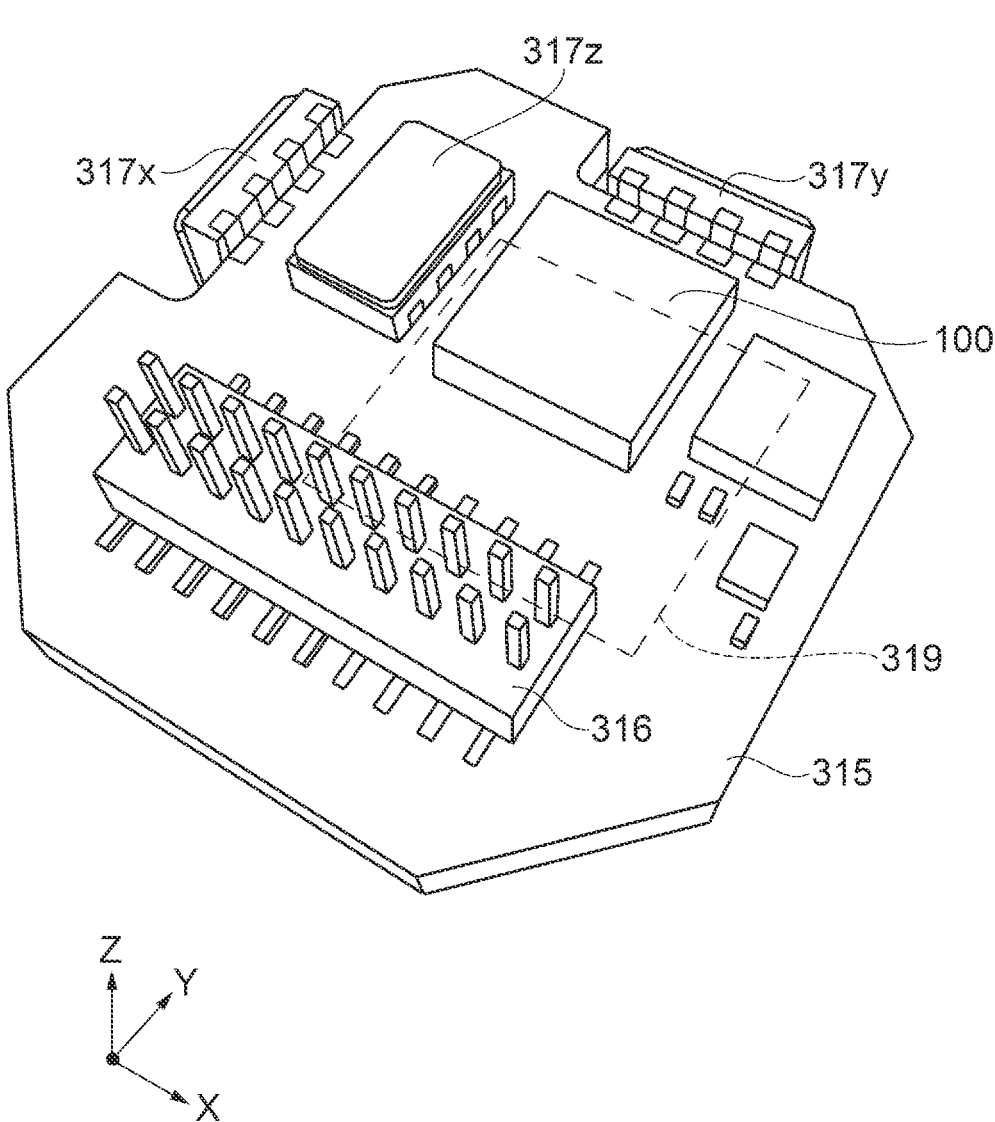
FIG. 15 is a perspective view of a substrate on which an inertial sensor is mounted.

As shown in FIG. 15, the circuit board 315 is a multilayer board in which a plurality of through holes are formed, and a glass epoxy board is used. The circuit board is not limited to the glass epoxy substrate. For example, a rigid substrate such as a composite substrate or a ceramic substrate may be used.

The connector 316, an acceleration detection unit 100, angular velocity sensors 317x, 317y, 317z, and the like are mounted on an upper surface and side surfaces of the circuit board 315.

The acceleration detection unit 100 is mounted with the inertial sensor 1 and is an acceleration sensor for measuring an acceleration in the Z-axis direction.

The connector 316 is a plug-type connector and includes two rows of coupling terminals disposed at equal pitches in the X-axis direction. In the embodiment, there are two rows of coupling terminals with 10 pins in a single row and 20 pins in total, and the number of coupling terminals may be changed as appropriate depending on design specifications.

The angular velocity sensor 317z is a gyro sensor that detects an angular velocity of one axis in the Z-axis direction. As a preferred example, a vibrating gyro sensor that uses quartz crystal as a vibrator and detects an angular velocity from a Coriolis force applied to a vibrating object is used. The sensor is not limited to the vibrating gyro sensor, and a sensor using ceramic or silicon as the vibrator may be used.

The angular velocity sensor 317x that detects an angular velocity of one axis in the X-axis direction is mounted on the side surface of the circuit board 315 in the X-axis direction such that a mounting surface is orthogonal to the X axis. Similarly, the angular velocity sensor 317y that detects an angular velocity of one axis in the Y-axis direction is mounted on the side surface of the circuit board 315 in the Y-axis direction such that the mounting surface is orthogonal to the Y axis.

The angular velocity sensors 317x, 317y, and 317z are not limited to the configuration using three angular velocity sensors each for a respective one of the X axis, the Y axis, and the Z axis, and any sensor that can detect the angular velocities in three axes may be used. For example, a sensor device that can detect the angular velocities in three axes in one device or package may be used.

The acceleration detection unit 100 is an acceleration sensor that measures an acceleration in the Z-axis direction, and may measure an acceleration in the X-axis direction or the Y-axis direction. In addition, a plurality of inertial sensors 1 may be mounted to detect the acceleration in two axial directions, for example, the Z-axis direction and the Y-axis direction, the Z-axis direction and the X-axis direction, or three axial directions, that is, the X-axis direction, the Y-axis direction, and the Z-axis direction.

A control IC 319 serving as a controller is mounted on the lower surface of the circuit board 315.

The control IC 319 is a micro controller unit (MCU), incorporates a storage including a nonvolatile memory, an A/D converter, and the like, and controls each unit of the inertial measurement unit 2000. The storage stores a program in which an order and contents for detecting an acceleration and an angular velocity are defined, a program in which detection data is digitized and incorporated into packet data, accompanying data, and the like. In addition, a plurality of electronic components are mounted on the circuit board 315.

According to the inertial measurement unit 2000, since the acceleration detection unit 100 including the inertial sensor 1 is used, it is possible to provide the inertial measurement unit 2000 having excellent impact resistance and improved reliability.

As described above, according to the inertial measurement unit 2000 including the inertial sensor 1 in the embodiment, in addition to the effects of Embodiment 1, it is possible to provide a highly reliable inertial measurement unit in which the influence of the stress is reduced.

Although preferred embodiments have been described above, the present disclosure is not limited to the above-described embodiments. In addition, the configuration of each unit according to the present disclosure can be replaced with any configuration that exhibits the same function as that of the above-described embodiments, and any configuration can be added.

What is claimed is:

1. An inertial sensor comprising:

a substrate including a first mount and a second mount;

a lid that faces the substrate and that includes a conductive member electrically coupling a substrate side and an opposite side from the substrate; and a sensor element provided between the substrate and the lid, the substrate side of the sensor element being bonded to the first mount and the second mount, and a lid side of the sensor element being coupled to the conductive member, wherein the sensor element includes a first coupling part bonded to the first mount through a first bonding part and coupled to the conductive member, an electrode including electrode fingers electrically coupled to the first coupling part, a second coupling part provided between the electrode and the first coupling part and bonded to the second mount through a second bonding part, and a wiring provided between the first coupling part and the second coupling part, and the second coupling part includes, in a plan view, a first part of the second coupling part overlapping the second bonding part, and a second part of the second coupling part not overlapping the second bonding part, and the second part of the second coupling part is formed with a first through hole.

2. The inertial sensor according to claim 1, wherein the first coupling part includes, in a plan view, a first part of the first coupling part overlapping the first bonding part, and a second part of the first coupling part not overlapping the first bonding part, and the second part of the first coupling part is formed with a second through hole.

3. The inertial sensor according to claim 1, wherein the first through hole is formed between the second bonding part and the wiring.

4. The inertial sensor according to claim 1, wherein the first through hole is formed between the second bonding part and the electrode.

5. An inertial measurement unit comprising:

the inertial sensor according to claim 1.

6. An inertial sensor comprising:

a substrate including a first mount, a second mount, and a third mount;

a lid that faces the substrate and that includes a conductive member electrically coupling a substrate side and an opposite side from the substrate; and a sensor element provided between the substrate and the lid, the substrate side of the sensor element being bonded to the first mount, the second mount, and the third mount, and a lid side of the sensor element being coupled to the conductive member, wherein the first mount, the second mount, and the third mount are provided in an order of the third mount, the first mount, and the second mount along a first direction, the sensor element includes a first coupling part bonded to the first mount through a first bonding part and coupled to the conductive member, an electrode including electrode fingers electrically coupled to the first coupling part, a second coupling part provided between the electrode and the first coupling part and bonded to the second mount through a second bonding part, a first wiring provided between the first coupling part and the second coupling part, a third coupling part provided between the electrode and the first coupling part and bonded to the third mount through a third bonding part, and a second wiring provided between the first coupling part and the third coupling part, the second coupling part includes, in a plan view, a first part of the second coupling part overlapping the second bonding part, and a second part of the second coupling part not overlapping the second bonding part, and the second part of the second coupling part is formed with a first through hole, the third coupling part includes, in a plan view, a first part of the third coupling part overlapping the third bonding part, and a second part of the third coupling part not overlapping the third bonding part, and the second part of the third coupling part is formed with a second through hole.

7. The inertial sensor according to claim 6, wherein the first coupling part includes, in a plan view, a first part of the first coupling part overlapping the first bonding part, and a second part of the first coupling part not overlapping the first bonding part, and the second part of the first coupling part is formed with a third through hole between the first wiring and the second part of the first coupling part, and is formed with a fourth through hole between the second wiring and the second part of the first coupling part.

8. An inertial sensor comprising:

a substrate including a first mount, a second mount, and a third mount;

a lid that faces the substrate and that includes a conductive member electrically coupling a substrate side an opposite side from the substrate; and a sensor element provided between the substrate and the lid, the substrate side of the sensor element being bonded to the first mount, the second mount, and the third mount, and a lid side of the sensor element being coupled to the conductive member, wherein the first mount, the second mount, and the third mount are
provided in an order of the third mount, the first mount,
and the second mount along a first direction, the sensor element includes a first coupling part bonded to the first mount through
a first bonding part and coupled to the conductive
member, an electrode including electrode fingers electrically
coupled to the first coupling part, a second coupling part provided between the electrode
and the first coupling part and bonded to the second
mount through a second bonding part, a first wiring provided between the first coupling part
and the second coupling part, a third coupling part provided between the electrode
and the first coupling part and bonded to the third
mount through a third bonding part, and a second wiring provided between the first coupling
part and the third coupling part, the first coupling part includes, in a plan view, a first part of the first coupling part overlapping the first
bonding part, and a second part of the first coupling part not overlapping
the first bonding part, the second part of the first coupling part is formed with a
first through hole between the first wiring and the
second part of the first coupling part, and is formed
with a second through hole between the second wiring
and the second part of the first coupling part.

* * * * *